US010778921B2

(12) United States Patent
Abe et al.

(10) Patent No.: US 10,778,921 B2
(45) Date of Patent: Sep. 15, 2020

(54) SOLID-STATE IMAGING DEVICE, AND CAMERA SYSTEM USING SAME

(71) Applicant: PANASONIC INTELLECTUAL PROPERTY MANAGEMENT CO., LTD., Osaka (JP)

(72) Inventors: Yutaka Abe, Osaka (JP); Kazuko Nishimura, Kyoto (JP); Hiroshi Fujinaka, Osaka (JP); Masahiro Higuchi, Hyogo (JP); Dai Ichiryu, Osaka (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 0 days.

(21) Appl. No.: 16/491,555

(22) PCT Filed: Feb. 27, 2018

(86) PCT No.: PCT/JP2018/007106
§ 371 (c)(1),
(2) Date: Sep. 5, 2019

(87) PCT Pub. No.: WO2018/163895
PCT Pub. Date: Sep. 13, 2018

(65) Prior Publication Data
US 2020/0036931 A1 Jan. 30, 2020

Related U.S. Application Data

(60) Provisional application No. 62/468,561, filed on Mar. 8, 2017.

(51) Int. Cl.
*H04N 5/374* (2011.01)
*H04N 5/3745* (2011.01)
(Continued)

(52) U.S. Cl.
CPC .......... *H04N 5/37455* (2013.01); *H03M 1/38* (2013.01); *H03M 1/56* (2013.01); *H04N 5/378* (2013.01)

(58) Field of Classification Search
None
See application file for complete search history.

(56) References Cited

U.S. PATENT DOCUMENTS

2010/0001892 A1* 1/2010 Aruga ................. H03M 1/1047
341/172
2013/0341489 A1 12/2013 Yoshida
(Continued)

FOREIGN PATENT DOCUMENTS

JP 2014-007527 A 1/2014

OTHER PUBLICATIONS

International Search Report and Written Opinion dated Jun. 5, 2018 in International Application No. PCT/JP2018/007106; with partial English translation.

*Primary Examiner* — James M Hannett
(74) *Attorney, Agent, or Firm* — McDermott Will & Emery LLP

(57) ABSTRACT

A solid-state imaging device includes an A/D converter per column. The A/D converter performs a first A/D conversion that (i) refines, using a first comparator, a range including a potential of an analog signal to a range of a potential corresponding to a difference between a first potential and a second potential through a binary search, and further (ii) generates, based on a result of the binary search, a first digital signal being a high-order portion of a digital signal. The A/D converter also performs a second A/D conversion that generates, based on a ramp signal and the result of the binary search, a second digital signal being a low-order portion of a remainder of the digital signal, by measuring a
(Continued)

time necessary for an output of a second comparator to be inverted.

19 Claims, 28 Drawing Sheets

(51) Int. Cl.
*H03M 1/38* (2006.01)
*H03M 1/56* (2006.01)
*H04N 5/378* (2011.01)

(56) References Cited

U.S. PATENT DOCUMENTS

2015/0248856 A1* 9/2015 Kishi .................. G09G 3/30
345/212
2017/0214869 A1* 7/2017 Ladd ................ H04N 5/37455

* cited by examiner

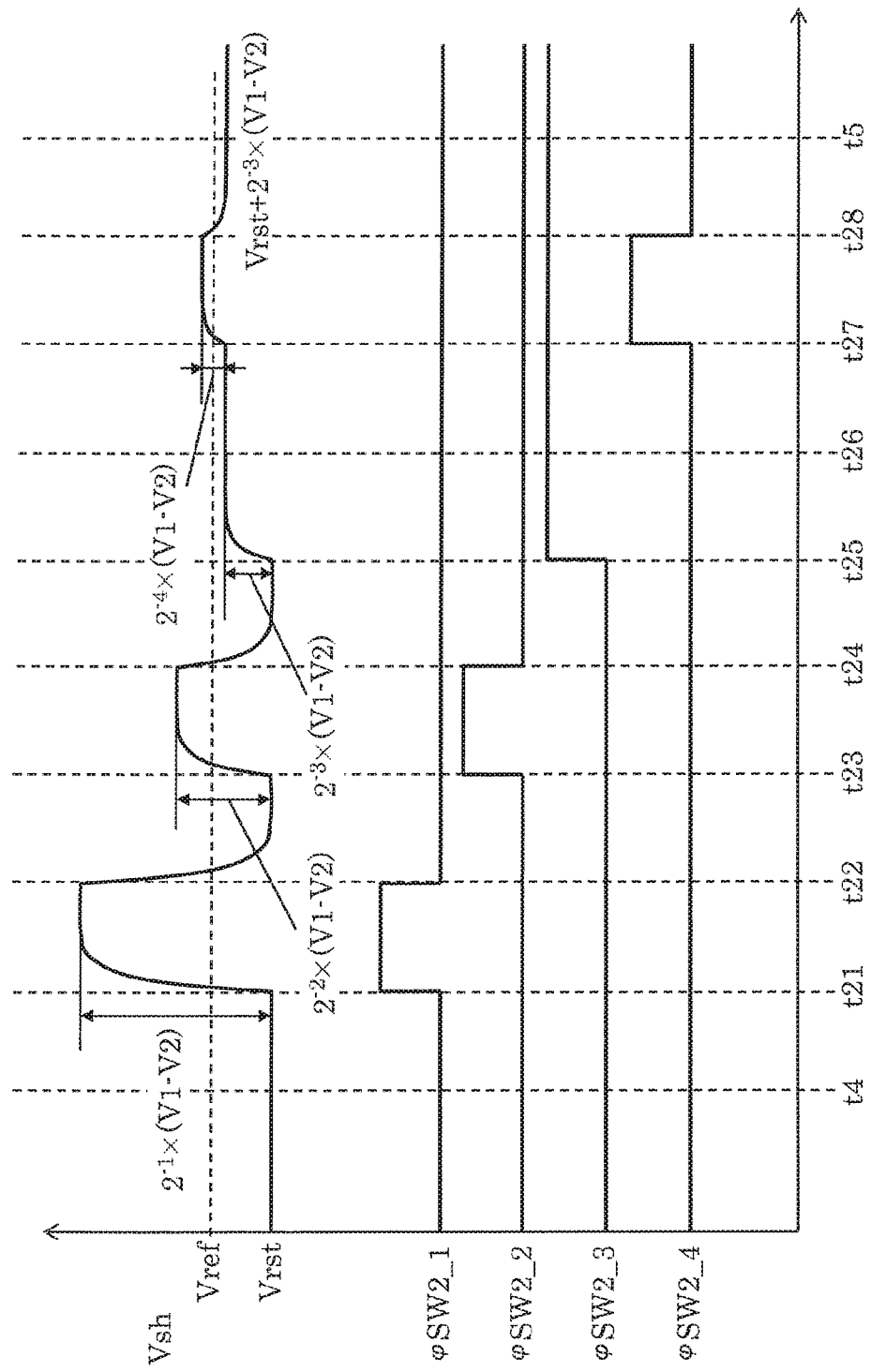

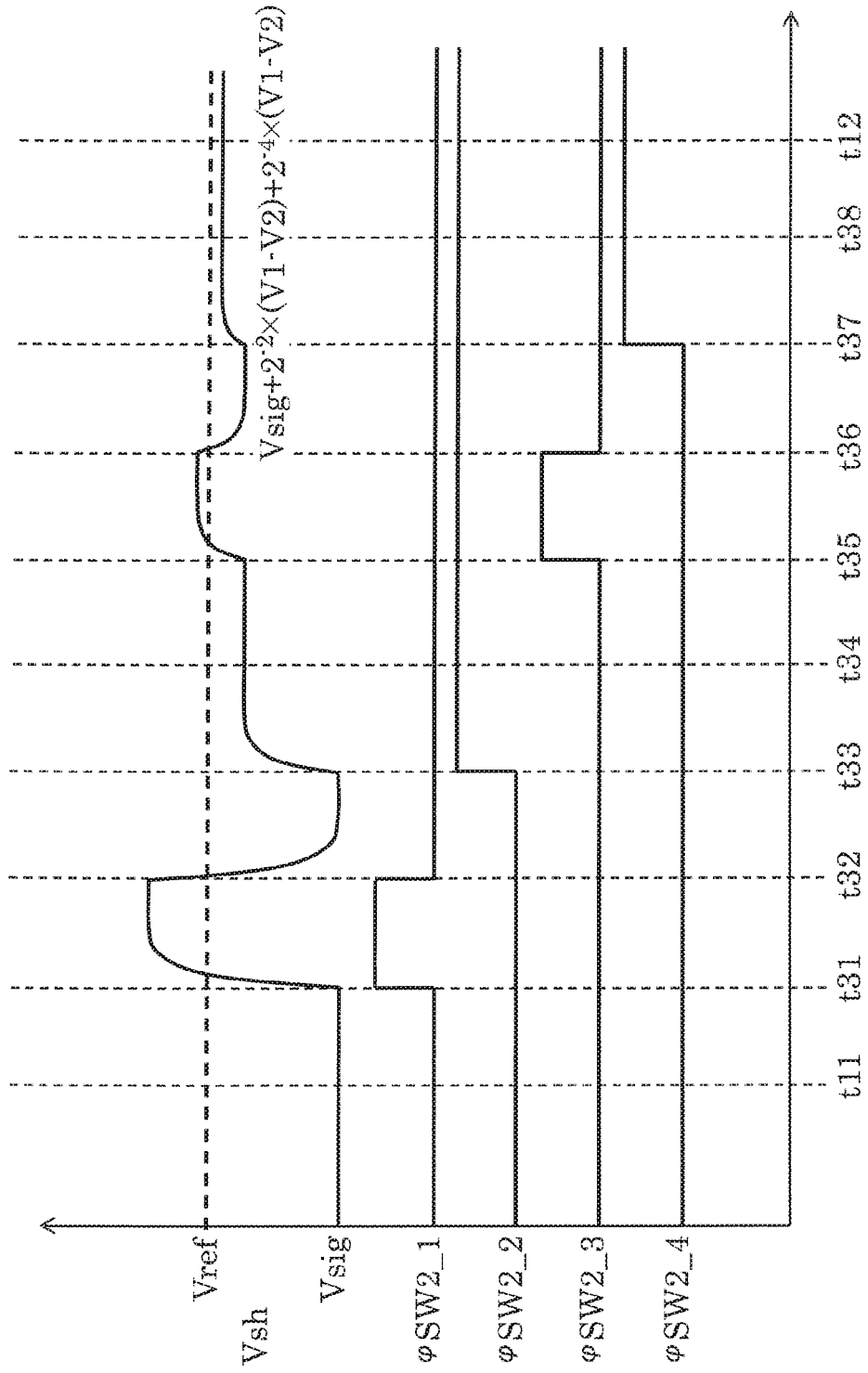

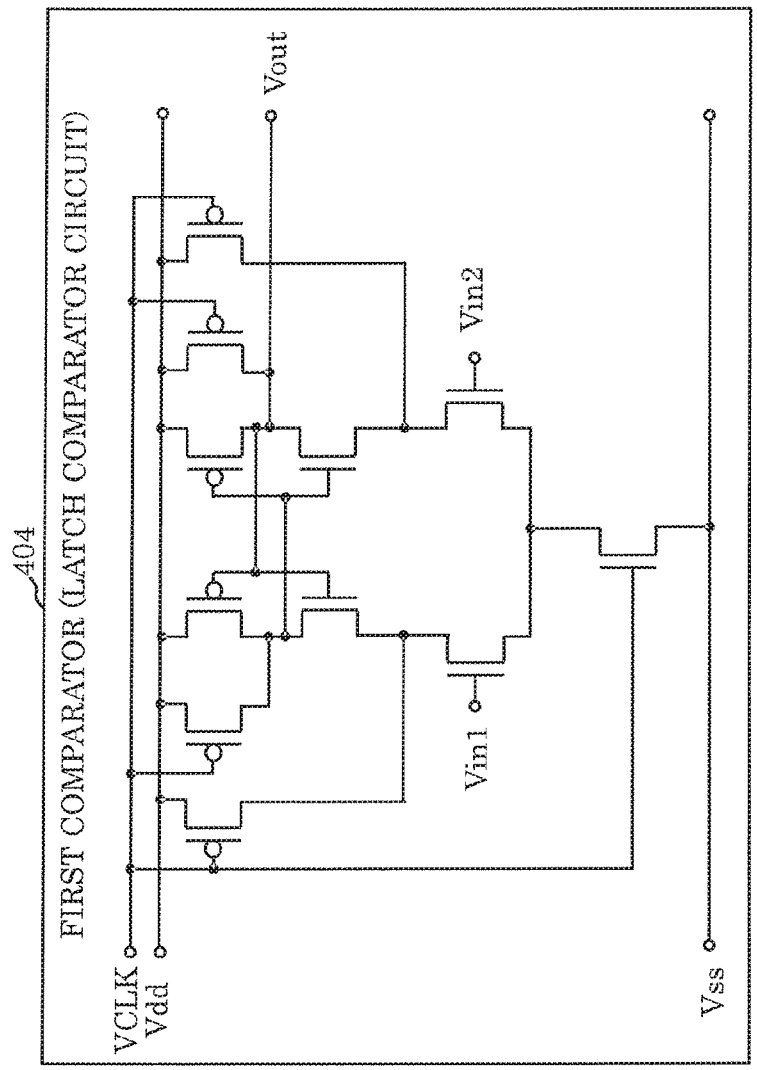

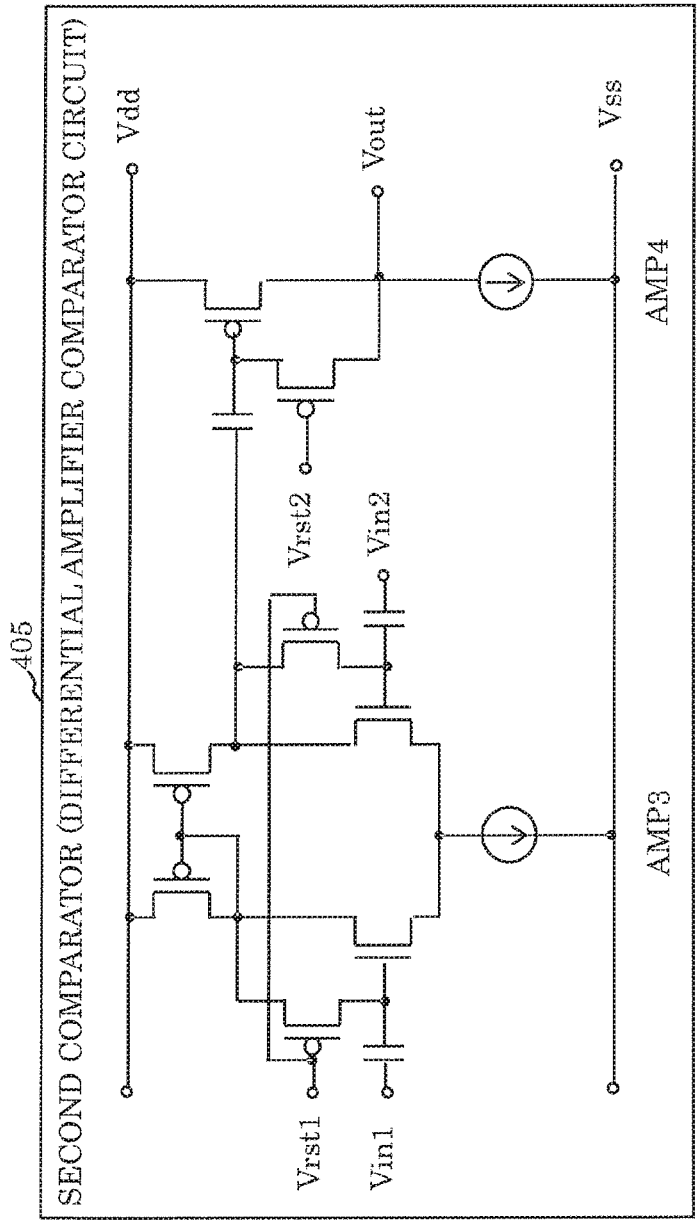

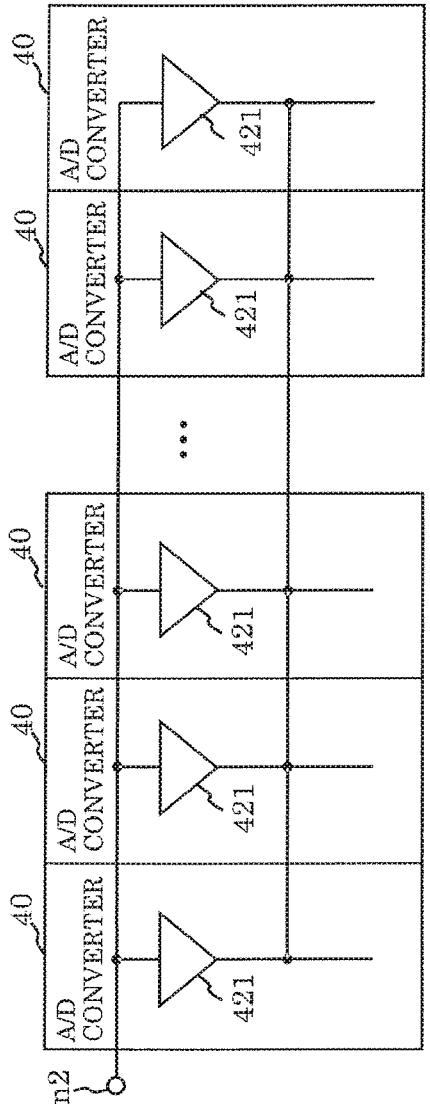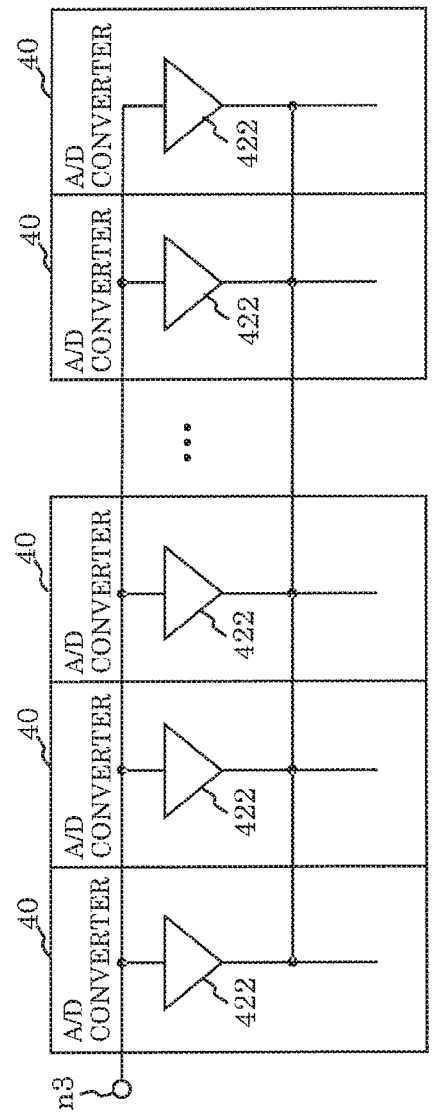

SOLID-STATE IMAGING DEVICE, AND CAMERA SYSTEM USING SAME

CROSS-REFERENCE OF RELATED APPLICATIONS

This application is the U.S. National Phase under 35 U.S.C. § 371 of International Patent Application No. PCT/JP2018/007106, filed on Feb. 27, 2018, which in turn claims the benefit of U.S. Provisional Application No. 62/468,561, filed on Mar. 8, 2017, the entire disclosures of which Applications are incorporated by reference herein.

TECHNICAL FIELD

The present disclosure relates to a solid-state imaging device and a camera system using the same.

BACKGROUND ART

In metal-oxide-semiconductor (MOS) image sensors that are capable of having a mix of peripheral circuits on a single chip, and especially in image sensors with a high number of pixels, a column analog-to-digital (A/D) conversion method is commonplace that simultaneously A/D converts a pixel output signal per pixel row.

In recent years, with the further advancement of frame rates and digital output data bitrates in solid-state imaging devices, A/D convertor circuits are being proposed that have a configuration in which different A/D conversion methods are used for high-order bits and low-order bits in order to perform a high-speed and high-resolution A/D conversion.

To give an example, Patent Literature (PTL) 1 discloses a column A/D convertor circuit that digitally converts high-order bits using a successive approximation A/D conversion method and digitally converts low-order bits using a single slope A/D conversion method.

CITATION LIST

Patent Literature

PTL 1: Japanese Unexamined Patent Application Publication No. 2014-007527.

SUMMARY OF THE INVENTION

Technical Problem

A/D conversion of high-order bits is performed using successive approximation A/D conversion (hereafter referred to as SAR conversion), A/D conversion of low-order bits is performed using single slope A/D conversion (hereafter referred to as SS conversion), and in this SAR+SS A/D conversion, a binary search is performed on an input signal during the SAR conversion, an analog value is refined, and the SS conversion is performed on the refined analog signal.

In PTL 1, a voltage of reference signal Vref needs to be matched to a range of a change in ramp signal Vrmp in order to implement a higher bitrate. The reason being that (i) when the voltage of Vref is too high with respect to the range of the change in ramp signal Vrmp, the A/D conversion cannot be performed correctly because a region that cannot be A/D converted occurs during the SS conversion, and (ii) when the range of the change in Vrmp is too large with respect to the voltage of Vref, the time used for SS conversion becomes longer than necessary and less time is saved.

Especially Vref and the range of the change in Vrmp need to be linked and voltages thereof need to change in order to enable changing the voltage range of an input analog signal to be A/D converted.

In view of the above problem, the present disclosure aims to provide a solid-state imaging device and camera system using the same, the solid-state imaging device implementing a high-speed SAR conversion and high-quality readout at a high frame rate due to an A/D conversion range during the SAR conversion and an A/D conversion range during the SS conversion causing the reference signal and the ramp signal to be linked so as to maintain a fixed relationship.

Solution to Problem

In order to solve the above problem, a solid-state imaging device according to an aspect of the present disclosure includes a plurality of pixel cells arranged in an X-direction and a Y-direction, the plurality of pixels cells each including a photoelectric converter that converts an optical signal to an electrical signal; a plurality of vertical signal lines arranged in the X-direction that are connected to the plurality of pixel cells and transmit the electrical signal as an analog signal; and a plurality of analog-to-digital (A/D) converters arranged in the X-direction that are respectively connected to the plurality of vertical signal lines and convert the analog signal to a digital signal. The plurality of A/D converters each include a first comparator and a second comparator; perform a first A/D conversion that (i) refines, using the first comparator, a range including a potential of the analog signal to a range of a potential corresponding to a difference between a first potential and a second potential through a binary search, and further (ii) generates, based on a result of the binary search, a first digital signal being a high-order portion of the digital signal; and perform a second A/D conversion that generates, based on a ramp signal and the result of the binary search, a second digital signal being a low-order portion of a remainder of the digital signal, by measuring a time necessary for an output of the second comparator to be inverted.

A camera system in the present disclosure includes the above solid-state imaging device.

Advantageous Effects of Invention

The present disclosure makes it possible to perform a high-resolution A/D conversion at a high speed and enables high-resolution imaging at a high frame rate.

BRIEF DESCRIPTION OF DRAWINGS

FIG. 8 is an operation timing diagram of the solid-state imaging device according to Embodiment 1.

FIG. 9 is an operation timing diagram of the solid-state imaging device according to Embodiment 1.

FIG. 10C is a diagram showing a configuration example of the first comparator.

FIG. 10F is a diagram showing another configuration example of the second comparator.

FIG. 12A is a diagram showing a buffer circuit in which output terminals are mutually connected.

FIG. 12B is a diagram showing a buffer circuit in which output terminals are mutually connected.

DESCRIPTION OF EXEMPLARY EMBODIMENTS

Figure 1:
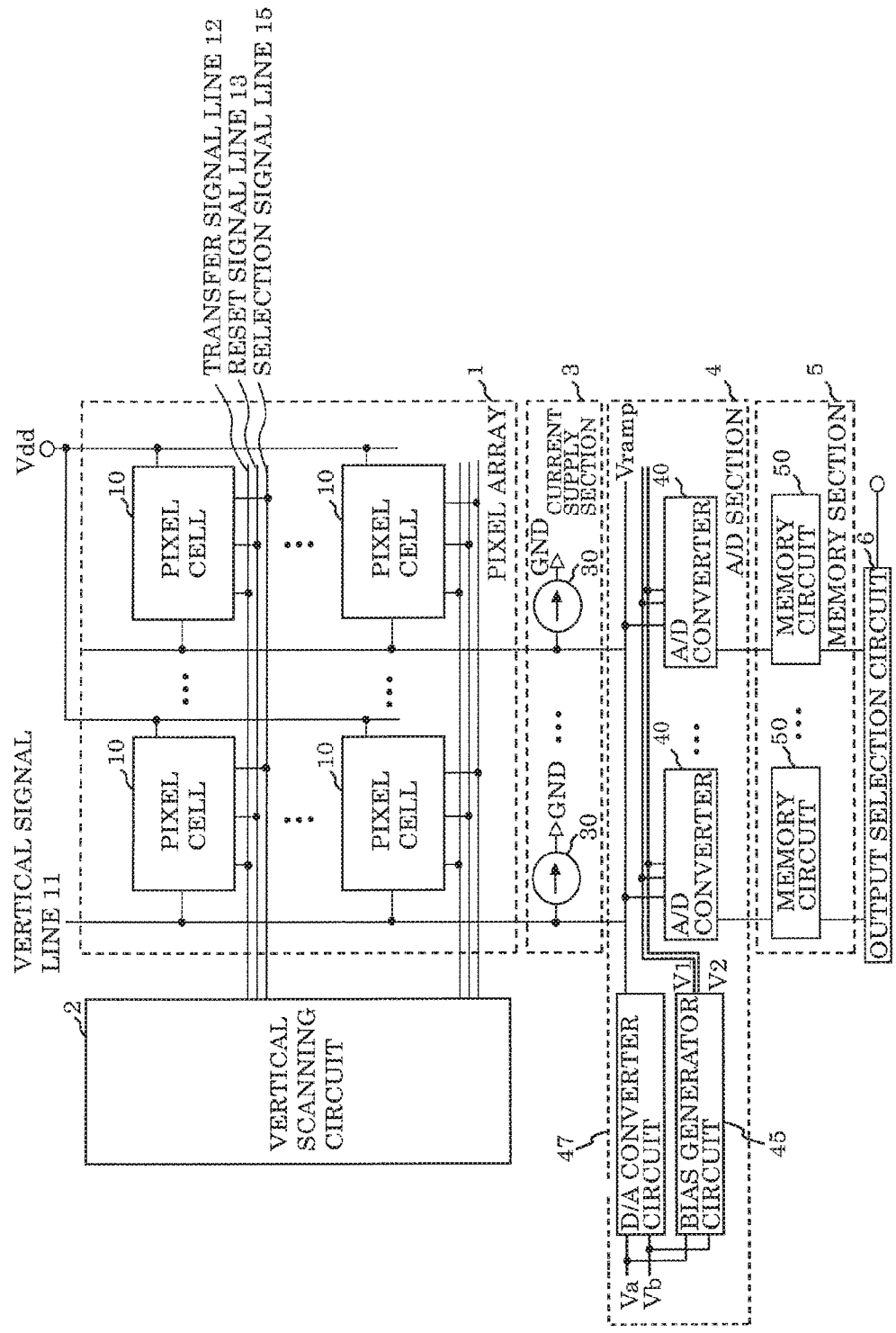
FIG. 1 is a diagram showing a configuration example of a solid-state imaging device according to Embodiment 1.

Hereinafter, embodiments in the present disclosure will be described with reference to the drawings. Note that the embodiments described below each show a specific example in the present disclosure. Numerical values, shapes, materials, components, placement and connection of the components, operation timing, and the like are mere examples and are not intended to limit the present disclosure. Components in the following embodiments not mentioned in any of the independent claims that define the broadest concepts are described as optional elements. The drawings do not necessarily provide strictly accurate illustrations. In the drawings, overlapping descriptions of components that are substantially the same as components described previous thereto are omitted or simplified.

Embodiment 1

FIG. 1 is a diagram showing a configuration example of the solid-state imaging device according to Embodiment 1.

The solid-state imaging device according to the present embodiment includes pixel array 1, vertical scanning circuit 2, current supply section 3, analog-to-digital (A/D) section 4, memory section 5, and output selection circuit 6.

Pixel array 1 includes pixel cells (single cells) 10 each including a photoelectric converter that converts an optical signal to an electrical signal. Pixel cells 10 are arranged in the X-direction and the Y-direction in an array (i.e., two-dimensionally). Pixel cells 10 belonging to the same column are connected to a shared vertical signal line 11. Pixel cells 10 belonging to the same row are connected to a shared transfer signal line 12, reset signal line 13, and selection signal line 15.

Vertical scanning circuit 2 sequentially scans pixel array 1 per row unit using transfer signal line 12, reset signal line 13, and selection signal line 15.

Current supply section 3 includes multiple current supplies 30 arranged in the X-direction. Current supplies 30 each pair up with a readout transistor in pixel cell 10, which is selected through the scanning, to form a source follower circuit.

A/D section 4 includes A/D converters 40 arranged in the X-direction, and bias generator circuit 45 and D/A converter circuit 47 shared between each of A/D converters 40.

Memory section 5 includes memory circuits 50 arranged in the X-direction.

Output selection circuit 6 selects memory circuit 50 and outputs a digital signal per pixel cell 10.

Figure 2:
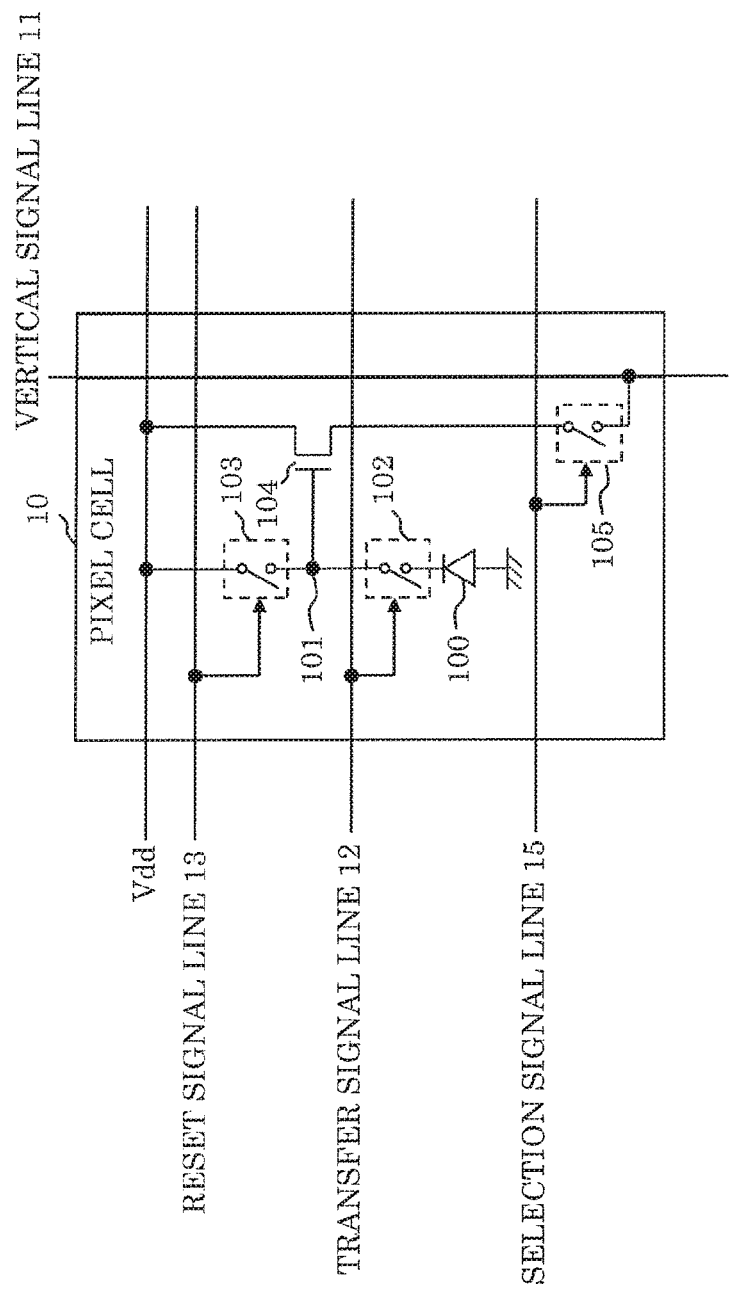
FIG. 2 is a diagram showing a configuration example of a pixel cell according to Embodiment 1.

FIG. 2 is a diagram showing a configuration example of pixel cell 10 according to Embodiment 1. Pixel cell 10 shown in FIG. 2 includes photodiode 100, floating diffuser (FD) 101, transfer transistor (transfer Tr) 102, reset transistor (reset Tr) 103, readout transistor (readout Tr) 104, and selection transistor (selection Tr) 105.

Photodiode 100 is a photoelectric conversion element (also referred to as photoelectric converter, light receiver, pixel) that converts an optical signal to an electrical signal. Signal charge produced in photodiode 100 is transferred to FD 101 and is temporarily retained by FD 101 as an electrical signal.

Transfer transistor 102 is disposed between photodiode 100 and FD 101, and transfers the signal charge from photodiode 100 to FD 101.

Reset transistor 103 is connected to and resets FD 101.

A gate of readout transistor 104 is connected to FD 101, and readout transistor 104 outputs a potential corresponding to a potential of FD 101.

Selection transistor 105 is disposed between readout transistor 104 and vertical signal line 11, selects an output of readout transistor 104, and outputs a potential signal from pixel cell 10 to vertical signal line 11.

A gate of transfer transistor 102 is connected to transfer signal line 12, a gate of reset transistor 103 is connected to reset signal line 13, and a gate of selection transistor 105 is connected to selection signal line 15.

Vertical scanning circuit 2 is connected to transfer signal line 12, reset signal line 13, and selection signal line 15, and controls each of pixel cells 10 so that pixel cells 10 produce and output an electrical signal corresponding to the optical signal per row.

Current supply section 3 includes current supplies 30 disposed in columns. Current supplies 30 are connected to vertical signal line 11 in each column, form the source follower circuit together with readout transistor 104 of each pixel cell in a corresponding column, and the potential of FD 101 is read out to vertical signal line 11 through the formed source follower circuit.

A/D section 4 includes A/D converter 40 disposed per vertical signal line 11 disposed per column, bias generator circuit 45, and D/A converter circuit 47. A/D converter 40 is connected to vertical signal line 11, bias generator circuit 45 that generates a bias signal, and D/A converter circuit 47 that generates the ramp signal, and converts the analog signal to be read out to vertical signal line 11 to a digital value.

Memory section 5 includes memory circuit 50 disposed per column. Memory circuit 50 temporarily retains the digital signal converted to a digital value by A/D converter 40.

Output selection circuit 6 sequentially selects and outputs the digital signal retained by memory circuit 50 per predetermined column.

Figure 3:
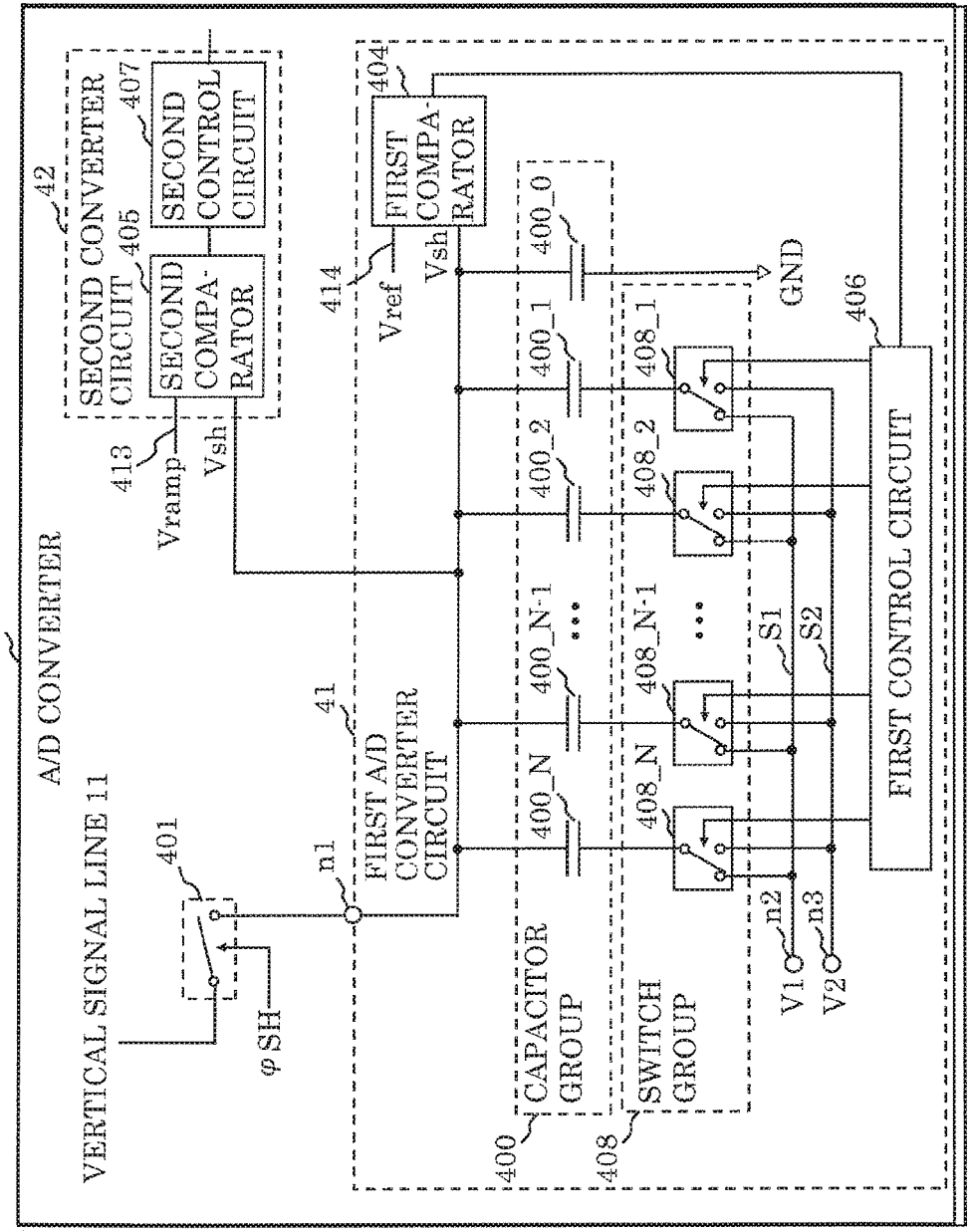
FIG. 3 is a diagram showing a configuration example of an A/D converter according to Embodiment 1.

FIG. 3 is a diagram showing a configuration example of A/D converter 40 according to the present embodiment.

The A/D converter circuit shown in FIG. 3 includes capacitor group 400 consisting of capacitors 400_0 to 400_4, first switch 401, first comparator 404, second comparator 405, first control circuit 406, second control circuit 407, second switch group 408 consisting of switches 408_1 to 408_4 disposed to correspond to capacitors 400_1 to 400_4, second node 411, third node 412, ramp signal line 413, and reference signal line 414.

Capacitors 400_0 to 400_4 are coupled to first node n1. Capacitors 400_0 to 400_4 each have a weighted capacitance value, which is a binary weighted capacitance value of $2^0 \times C$, $2^1 \times C$, $2^2 \times C$, $2^3 \times C$, $2^4 \times C$ in the present example, but is not necessarily limited thereto.

First switch 401 is disposed between vertical signal line 11 and first node n1, transmits the analog signal output from vertical signal line 11 to first node n1 by being turned on, and retains a total charge of capacitor group 400 by being turned off.

First comparator 404 is connected to first node n1 and reference signal line 414, compares a quantitative relationship between a potential of first node n1 and reference potential Vref of reference signal line 414, and outputs this result to first control circuit 406.

Second switches 408_1 to 408_N select and connect either second node n2 or third node n3 to capacitors 400_1 to 400_N in accordance with an output of first control circuit 406.

First control circuit 406 performs a control of second switches 408_1 to 408_N corresponding to an output of first comparator 404 so that a range including the potential of first node n1 is refined through a binary search, and also generates a first digital signal corresponding to a result of the binary search. The first digital signal is a high-order portion of the digital signal that is converted from the analog signal of vertical signal line 11.

Second comparator 405 is connected to first node n1 and ramp signal line 413, compares a quantitative relationship between potential Vsh of first node n1 and a potential of the ramp signal line, and outputs this result to second control circuit 407.

Second control circuit 407 measures the time necessary for the quantitative relationship between potential Vsh of first node n1 and the potential of the ramp signal to be inverted, and generates a second digital signal corresponding to the measured time. The second digital signal is a low-order portion that is remainder of the digital signal that is converted from the analog signal of vertical signal line 11.

Bias generator circuit 45 generates two signals, a signal necessary for generating the first digital signal and a signal that is a reference of the first A/D conversion. In other words, bias generator circuit 45 generates a first signal having first potential $V_1$ and a second signal having second potential $V_2$.

Figure 4:
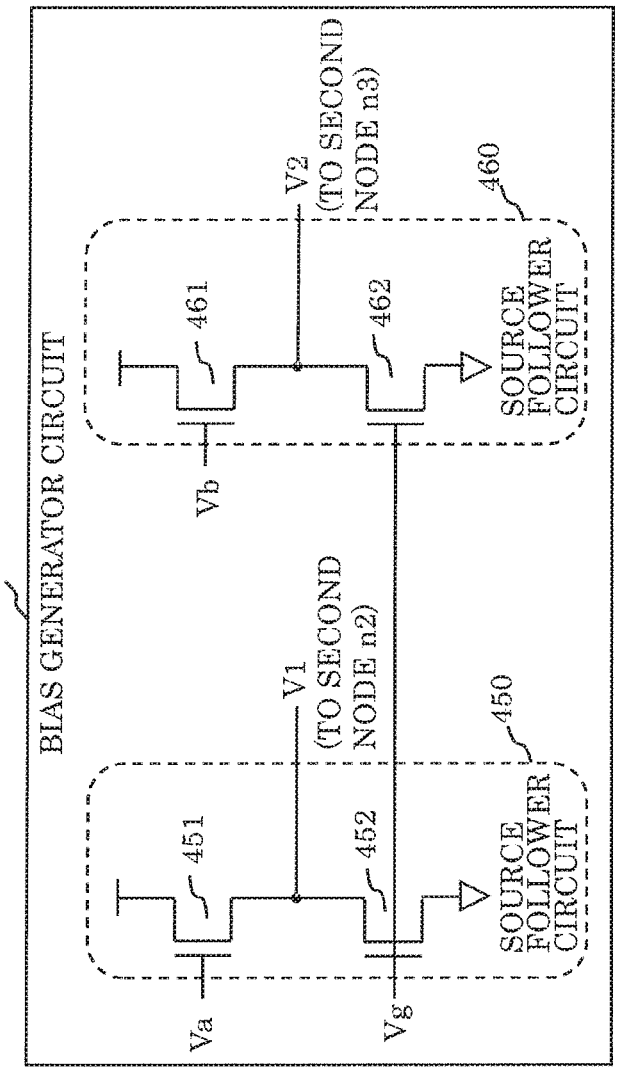
FIG. 4 is a diagram showing a configuration example of a bias generator circuit according to Embodiment 1.

FIG. 4 is a diagram showing a configuration example of bias generator circuit 45 according to Embodiment 1.

Bias generator circuit 45 in FIG. 4 includes source follower circuit 450 and source follower circuit 460, and generates first potential $V_1$ and second potential $V_2$ using first input potential Va and second input potential Vb.

Source follower circuit 450 includes transistor 451 and transistor 452, and connects a source of transistor 451, a drain of transistor 452, and second node n2. Potential $V_1$ of second node n2 becomes $V_1=Va-V_{sf1}$ by setting a gate of transistor 451 to first input potential Va. $V_{sf1}$ can be set to a suitable value by a designer by adjusting transistor 451, transistor 452, a gate potential of transistor 452, etc.

Similarly, source follower circuit 460 includes transistor 461 and transistor 462. Source follower circuit 460 connects a source of transistor 461, a drain of transistor 462, and third node n3. Potential $V_2$ of third node n3 becomes $V_2=Vb-V_{sf2}$ by setting a gate of transistor 461 to second input potential Vb. $V_{sf2}$ can be set to a suitable value by the designer by adjusting transistor 461, transistor 462, a gate potential of transistor 462, etc. Transistor 451 and transistor 461, and transistor 452 and transistor 462 are the same size respectively. As illustrated in FIG. 4, $V_{sf1}=V_{sf2}$ by setting the gates of transistor 452 and transistor 461 to a shared potential Vg, and a potential difference between $V_1$ and $V_2$ is the same as a potential difference between Va and Vb.

D/A converter circuit 47 generates the ramp signal necessary for generating the second digital signal.

Figure 5:
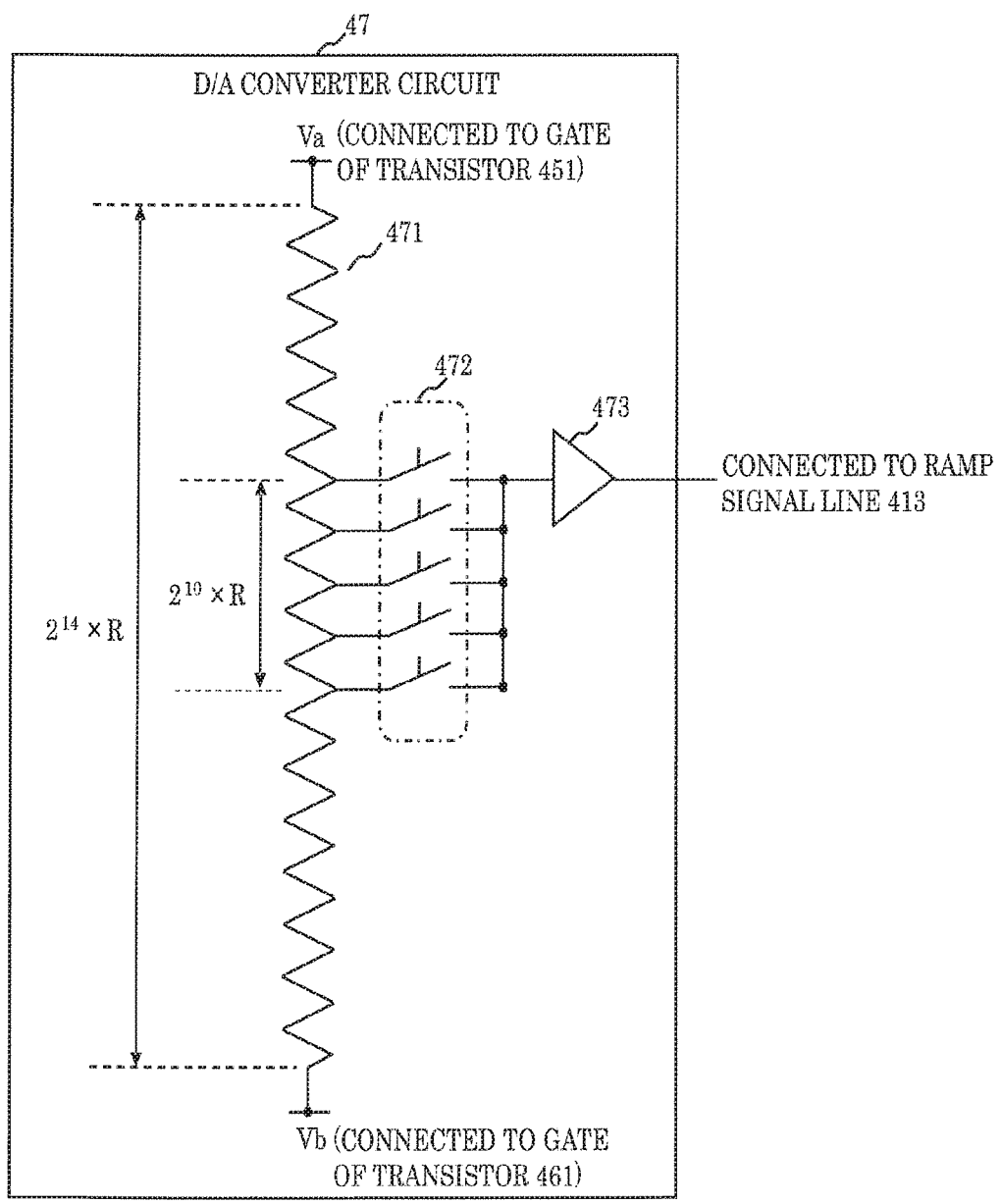
FIG. 5 is a diagram showing a configuration example of a digital-to-analog (D/A) converter circuit according to Embodiment 1.

FIG. 5 is a diagram showing a configuration example of D/A converter circuit 47 according to Embodiment 1. D/A converter circuit 47 includes resistor 471 of which $2^{14}$ unit resistors are connected in series and have a resistance value of R; switch group 472 having first terminals connected to $2^{10}$ unit resistors continuing from an optional location of a unit resistor, and second terminals mutually connected; and buffer circuit 473 connected to switch group 472. First input potential Va is input into an upper end of resistor 471 and second input potential Vb is input into a lower end of resistor 471. An output of buffer circuit 473 is connected to ramp signal line 413.

Figure 6:
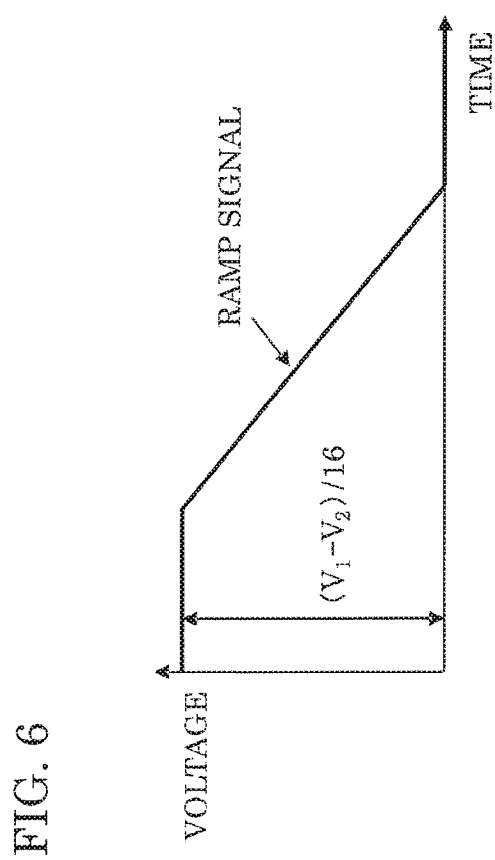
FIG. 6 is a diagram explaining an operation of the solid-state imaging device according to Embodiment 1.

The ramp signal is output to the ramp signal line with a change range of $(V_1-V_2)/16$, as illustrated in FIG. 6, by causing an optional resistor connected to a switch to be first turned on and neighboring resistors connected to the switch to be turned on in a sequential order.

Output selection circuit 6 sequentially assigns a column to be read out and reads out the first digital signal and the second digital signal generated in each column.

Figure 7:
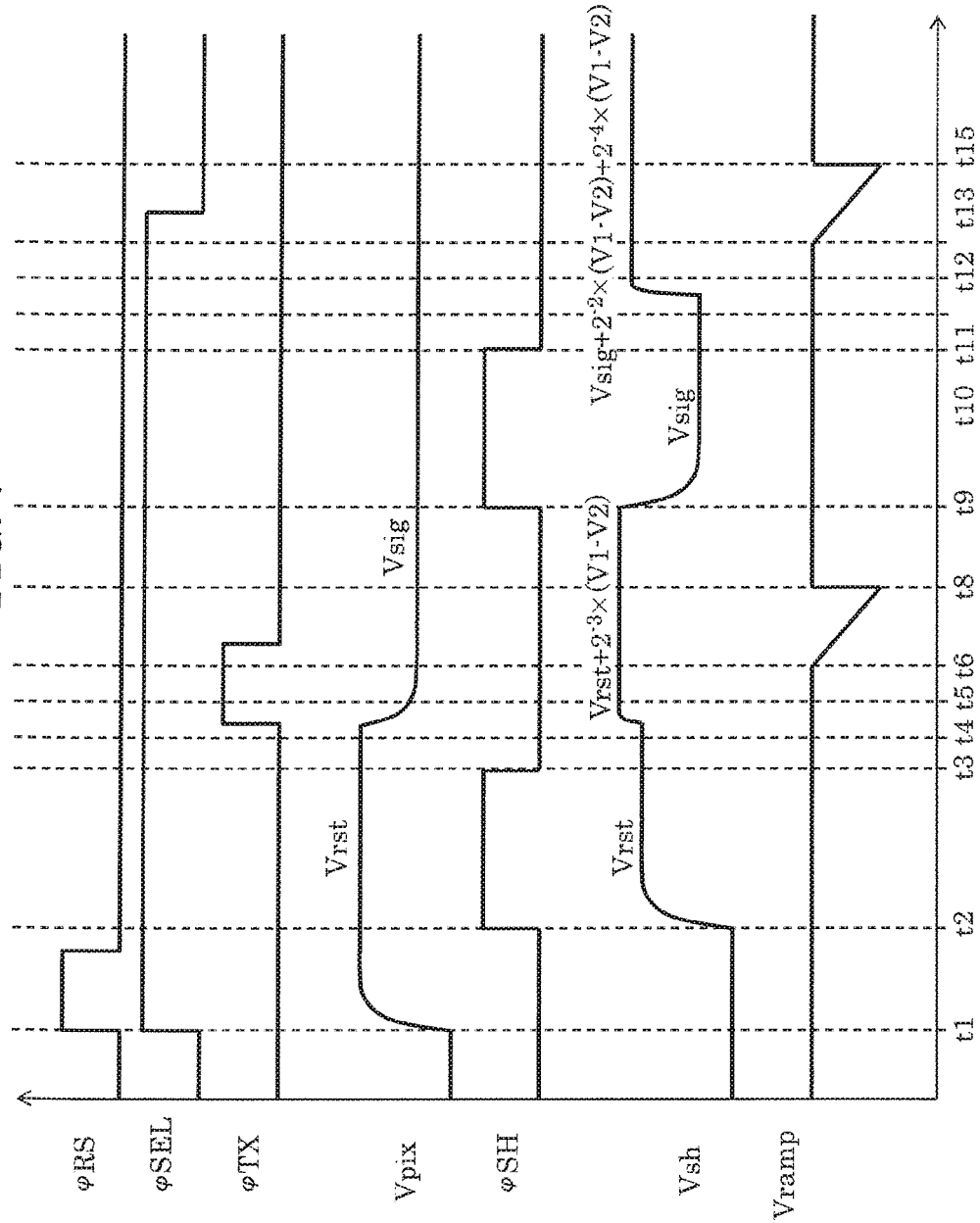
FIG. 7 is an operation timing diagram of the solid-state imaging device according to Embodiment 1.

FIG. 7, FIG. 8, and FIG. 9 are operation timing diagrams of the solid-state imaging device in FIG. 1.

In FIG. 7, FIG. 8, and FIG. 9, the horizontal axis represents the time and the vertical axis represents a potential of each signal. φRS represents a pulse signal that commonly controls reset transistors in a predetermined row. φTX represents a pulse signal that commonly controls transfer transistors in the predetermined row. φSEL represents a pulse signal that commonly controls selection transistors in the predetermined row. $V_{pix}$ represents a potential of vertical signal line 11 connected to a predetermined pixel cell. φSH represents a pulse signal that commonly controls first switches 401. $V_{sh}$ represents the potential of first node n1 of the A/D converter circuit in a predetermined column. $V_{ramp}$ represents a potential of ramp signal line 413. $V_{ref}$ represents a potential of reference signal line 414. $V_1$ (V1 in the drawing) represents the first potential. $V_2$ (V2 in the drawing) represents the second potential. φSW2_1 to φSW2_4 represent a pulse signal that controls the second switches in the predetermined column.

Second switches 408_1 to 408_4 respectively supply $V_2$ to capacitors 400_1 to 400_4 when pulse signals φSW2_1 to φSW2_4, which control second switches 408_1 to 408_4, are at a low level, and respectively supply $V_1$ to capacitors 400_1 to 400_4 when pulse signals φSW2_1 to φSW2_4 are at a high level.

In FIG. 7, when setting φSEL and φRS to a high level at time t1, all selection transistors 105 connected to φSEL and reset transistors 103 connected to φRS are turned on, the potential of FD 101 in the corresponding row is reset, and potential $V_{pix}$ of vertical signal line 11 becomes $V_{rst}$ that represents a reset control level.

When setting φSH to a high level at time t2, all first switches 401 connected to φSH are turned on, and the potential of vertical signal line 11 in each column and the potential of first node n1 in each column become equal. Therefore, $V_{sh}$ transitions to $V_{rst}$. By setting φSH to a low level at time t3, $V_{sh}$ is retained by $V_{rst}$.

The first A/D conversion is performed during time t4 and time t5, but detailed description thereof is shown in FIG. 8.

In FIG. 8, when setting φSW2_1 to a high level at time t21, a signal supplied to capacitor 400_1 is switched from second potential $V_2$ to first potential $V_1$. Since φSH1 is at a low level, $V_{sh}$ increases by only $(V_1-V_2)/2$, because the total charge of capacitors 400_0 to 400_N does not change.

When first comparator 404 compares $V_{ref}$ and $V_{sh}$ at time t22 and $V_{sh}$ is higher, first control circuit 406 returns φSW2_1 to a low level, and when $V_{sh}$ is lower, first control circuit 406 maintains φSW2_1 at a high level. Since $V_{sh}$ is higher here, φSW2_1 returns to a low level, the signal supplied to capacitor 400_1 also returns to second potential $V_2$, and $V_{sh}$ returns to $V_{rst}$.

When setting φSW2_2 to a high level at time t23, $V_{sh}$ increases by only $(V_1-V_2)/2^2$. When first comparator 404 compares $V_{ref}$ and $V_{sh}$ at time t24 and $V_{sh}$ is higher, first control circuit 406 returns φSW2_2 to a low level, and when $V_{sh}$ is lower, first control circuit 406 maintains φSW2_2 at a high level. Since $V_{sh}$ is higher here, φSW2_2 returns to a low level, the signal supplied to capacitor 400_2 also returns to second potential $V_2$, and $V_{sh}$ returns to $V_{rst}$.

When setting φSW2_3 to a high level at time t25, $V_{sh}$ increases by only $(V_1-V_2)/2^3$. When first comparator 404 compares $V_{ref}$ and $V_{sh}$ at time t26 and $V_{sh}$ is higher, first control circuit 406 returns φSW2_3 to a low level, and when $V_{sh}$ is lower, first control circuit 406 maintains φSW2_3 at a high level. Since $V_{sh}$ is lower here, φSW2_3 is maintained at a high level, the signal supplied to capacitor 400_3 is also maintained at first potential $V_1$, and $V_{sh}$ is maintained at $V_{rst}+(V_1-V_2)/2^3$.

When setting φSW2_4 to a high level at time t27, $V_{sh}$ increases by only $(V_1-V_2)/2^4$. When first comparator 804 compares $V_{ref}$ and $V_{sh}$ at time t28 and $V_{sh}$ is higher, first control circuit 406 returns φSW2_4 to a low level, and when $V_{sh}$ is lower, first control circuit 406 maintains φSW2_4 at a high level. Since $V_{sh}$ is higher here, φSW2_4 returns to a low level, the signal supplied to capacitor 400_4 also returns to second potential $V_2$, and $V_{sh}$ returns to $V_{rst}+(V_1-V_2)/2^3$.

Upon setting states r1 to r4 of φSW2_1 to φSW2_4 to 0 when each are at a low level and to 1 when each are at a high level, the first control circuit outputs, due to the above first A/D conversion operation, first digital signal D1_rst={r1, r2, r3, r4}={0, 0, 1, 0}, and $V_{sh}$ becomes $V_{rst}+(V_1-V_2)/2^3$.

In FIG. 7, φ$V_{ramp}$ begins a drop at time t6. Second control circuit 407 measures time Td until time t7 (t7 is not illustrated) at which a quantitative relationship between $V_{sh}$ and φ$V_{ramp}$ is inverted, and outputs second digital signal D2_rst corresponding to Td. The drop of φ$V_{ramp}$ stops at time t8.

When setting φTX to a high level between times t3 to t8, all transfer transistors 102 connected to φTX are turned on, electrons produced in photodiode 100 of the corresponding row are transferred to FD 101, and potential V''' of vertical signal line 11 becomes $V_{sig}$ dropped down from $V_{rst}$ by only a potential amount corresponding to the number of transferred electrons.

When setting φSH to a high level at time t9, all first switches 401 connected to φSH are turned on, and the potential of the vertical signal line in each column and the potential of first node n1 in each column become equal. Therefore, $V_{sh}$ transitions to $V_{sig}$. By setting φSH to a low level at time t10, $V_{sh}$ is retained by $V_{sig}$.

The first A/D conversion is performed during time t11 and time t12, but detailed description thereof is shown in FIG. 9.

Note that it is not illustrated, but SW2_1 to SW2_4 are all reset to a low level between times t8 and t9.

In FIG. 9, when setting φSW2_1 to a high level at time t31, a signal supplied to capacitor 400_1 is switched from first potential $V_1$ to second potential $V_2$, and $V_{sh}$ increases by only $(V_1-V_2)/2$.

When first comparator 404 compares $V_{ref}$ and $V_{sh}$ at time t32 and $V_{sh}$ is higher, first control circuit 406 returns φSW2_1 to a low level, and when $V_{sh}$ is lower, first control circuit 406 maintains φSW2_1 at a high level. Since $V_{sh}$ is higher here, φSW2_1 returns to a low level, the signal supplied to capacitor 400_1 also returns to second potential $V_2$, and $V_{sh}$ returns to $V_{rst}$.

When setting φSW2_2 to a high level at time t33, $V_{sh}$ increases by only $(V_3-V_4)/2^2$. When first comparator 404 compares $V_{ref}$ and $V_{sh}$ at time t34 and $V_{sh}$ is higher, first control circuit 406 returns φSW2_2 to a low level, and when $V_{sh}$ is lower, first control circuit 406 maintains φSW2_2 at a high level. Since $V_{sh}$ is lower here, φSW2_2 is maintained at a high level, the signal supplied to capacitor 400_2 is also maintained at first potential $V_1$, and $V_{sh}$ is maintained at $V_{rst}+(V_1-V_2)/2^2$.

When setting φSW2_3 to a high level at time t35, $V_{sh}$ increases by only $(V_1-V_2)/2^3$. When first comparator 404 compares $V_{ref}$ and $V_{sh}$ at time t16 and $V_{sh}$ is higher, first control circuit 406 returns φSW2_3 to a low level, and when $V_{sh}$ is lower, first control circuit 406 maintains φSW2_3 at a high level. Since $V_{sh}$ is higher here, φSW2_3 returns to a low level, the signal supplied to capacitor 400_1 also returns to $V_2$, and $V_{sh}$ returns to $V_{rst}+(V_1-V_2)/2^2$.

When setting φSW2_4 to a high level at time t37, $V_{sh}$ increases by only $(V_1-V_2)/2^4$. When first comparator 404 compares $V_{ref}$ and $V_{sh}$ at time t38 and $V_{sh}$ is higher, first control circuit 406 returns φSW2_4 to a low level, and when $V_{sh}$ is lower, first control circuit 406 maintains φSW2_4 at a high level. Since $V_{sh}$ is lower here, φSW2_4 is maintained at a high level, the signal supplied to capacitor 400_4 is also maintained at $V_1$, and $V_{sh}$ is maintained at $V_{rst}+(V_1-V_2)/2^2+(V_1-V_2)/2^4$.

Upon setting states s1 to s4 of φSW2_1 to φSW2_4 to 0 when each are at a low level and to 1 when each are at a high level, first control circuit 406 outputs, due to the above first A/D conversion operation, first digital signal D1_rst={s1, s2, s3, s4}={0, 1, 0, 1}, and $V_{sh}$ becomes $V_{rst}-(V_1-V_2)/2^2 + (V_1-V_2)/2^4$.

In FIG. 7, $\varphi V_{ramp}$ begins a drop at time t13. Second control circuit 407 measures time Tu until time t14 (t14 is not illustrated) at which the quantitative relationship between $V_{sh}$ and $\varphi V_{ramp}$ is inverted, and outputs second digital signal D2_sig corresponding to Tu. The drop of $\varphi V_{ramp}$ stops at time t15.

During the second A/D conversion operation, $V_{sh}$ can range between $V_{ref}$ and $V_{ref}(V_1-V_2)/16$. $\varphi V_{ramp}$ can also range between $V_{ref}$ and $V_{ref}-(V_1-V_2)/16$ by setting a position of a start resistor in the D/A converter circuit to $V_{ref}$. In other words, it is possible to set the range of $V_{ramp}$ without excess or deficiency with respect to a potential necessary for the second A/D conversion and to perform the second A/D conversion in the shortest amount of time possible. Since it is possible to optionally set an input range that can be A/D converted by adjusting the potential difference between $V_1$ and $V_2$, it is also possible to perform the A/D conversion within a suitable range in accordance with a quantity of light incident on the pixels, to perform a high-speed and high-resolution A/D conversion, and to implement a high-quality image sensor with a high frame rate.

In the present embodiment, a specific configuration of the bias generator circuit and the D/A converter circuit is shown and described, but is not limited to the foregoing.

Figure 10A:
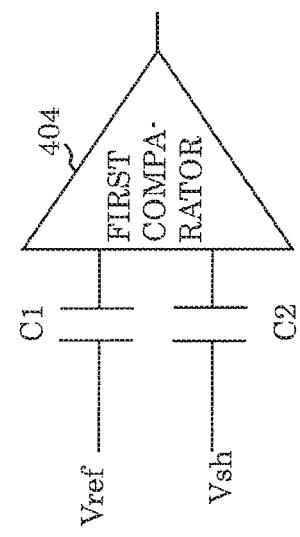
FIG. 10A is a diagram showing a configuration example of a first comparator having an input capacitance.
Figure 10B:
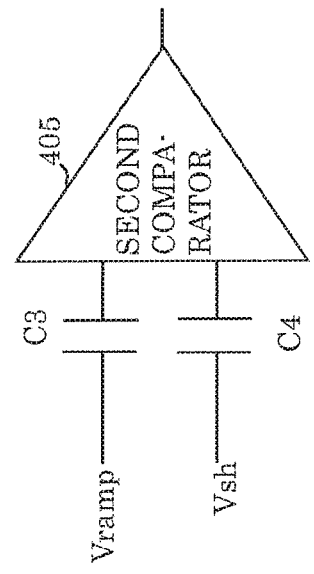
FIG. 10B is a diagram showing a configuration example of a second comparator having an input capacitance.

As illustrated in FIG. 10A and FIG. 10B, it is possible to decrease a direct current (DC) component by inserting capacitive elements C1, C2, C3, and C4 in an inputter of each of first comparator 404 and second comparator 405, the start position in the D/A converter circuit no longer needs to be set to $V_{ref}$ making it possible to set the start position to a potential of choice.

As stated above, first comparator 404 is used in the first A/D conversion during which the first digital signal is obtained through the binary search. Noise from first comparator 404 is superimposed over the first digital signal, but as the above expressions illustrate, the noise is canceled out during the second A/D conversion since the noise is also added to the potential of first node n1, and there is no influence on the ultimately obtained digital conversion value. On the other hand, when the operation speed of first comparator 404 is low, the first A/D conversion ends up requiring more time.

Figure 10D:
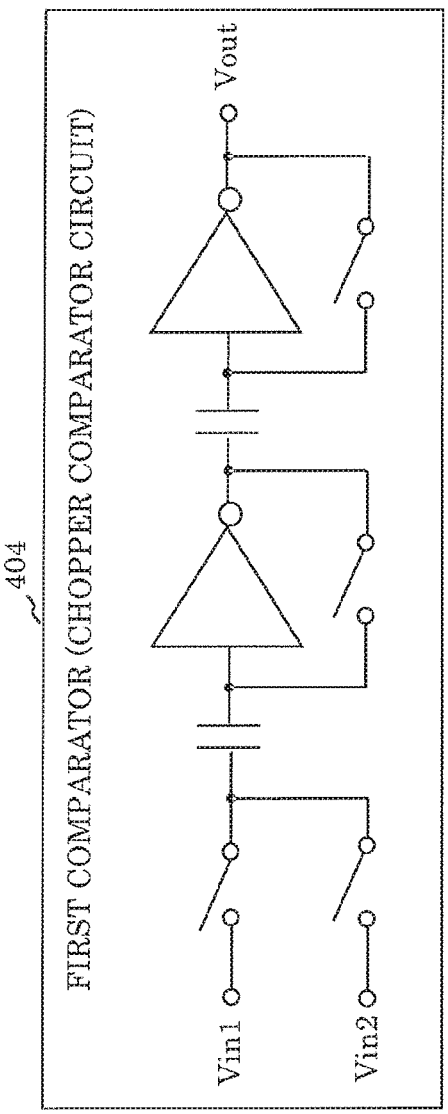
FIG. 10D is a diagram showing another configuration example of the first comparator.

This enables high-speed digital conversion without influencing the A/D conversion precision by using, for example, a high-speed latch comparator circuit as shown in FIG. 10C or a high-speed chopper comparator circuit as shown in FIG. 10D in first comparator 404, because the noise from the first A/D conversion operation does not influence the ultimately obtained digital conversion value.

Figure 10E:
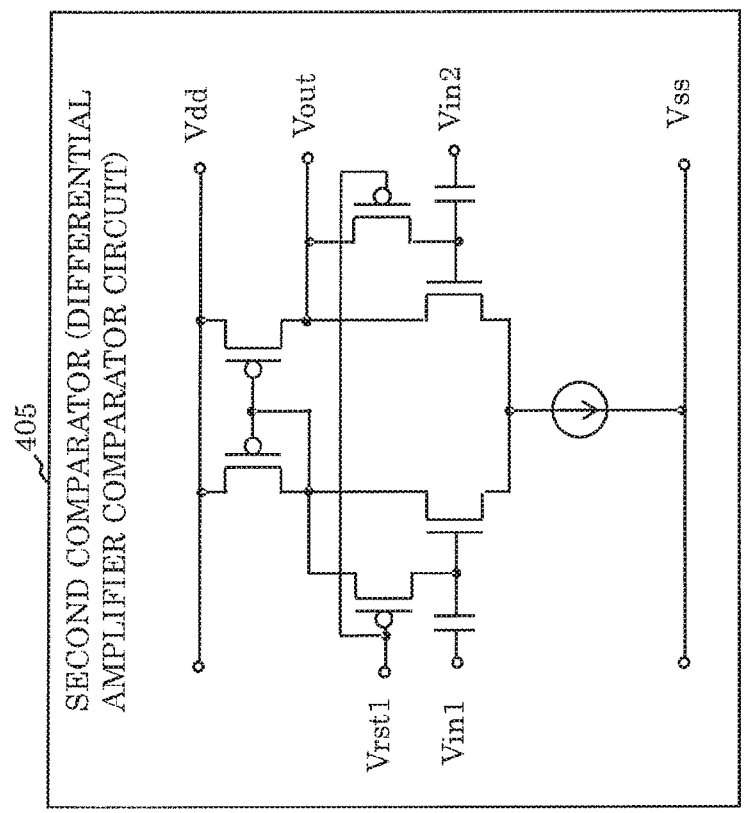
FIG. 10E is a diagram showing a configuration example of the second comparator.

In contrast, the noise from second comparator 405 is superimposed over the second digital signal which causes errors in the A/D conversion. However, the amount of time necessary for the second A/D conversion depends on a clock frequency for measuring the time, and even when the operation speed of the second comparator is low, the amount of time necessary for the second A/D conversion does not increase. Accordingly, a high-precision digital conversion is possible without influencing the A/D conversion speed by using, for example, a low-noise differential amplifier comparator circuit as shown in FIG. 10E and FIG. 10F in second comparator 405.

Figure 11:
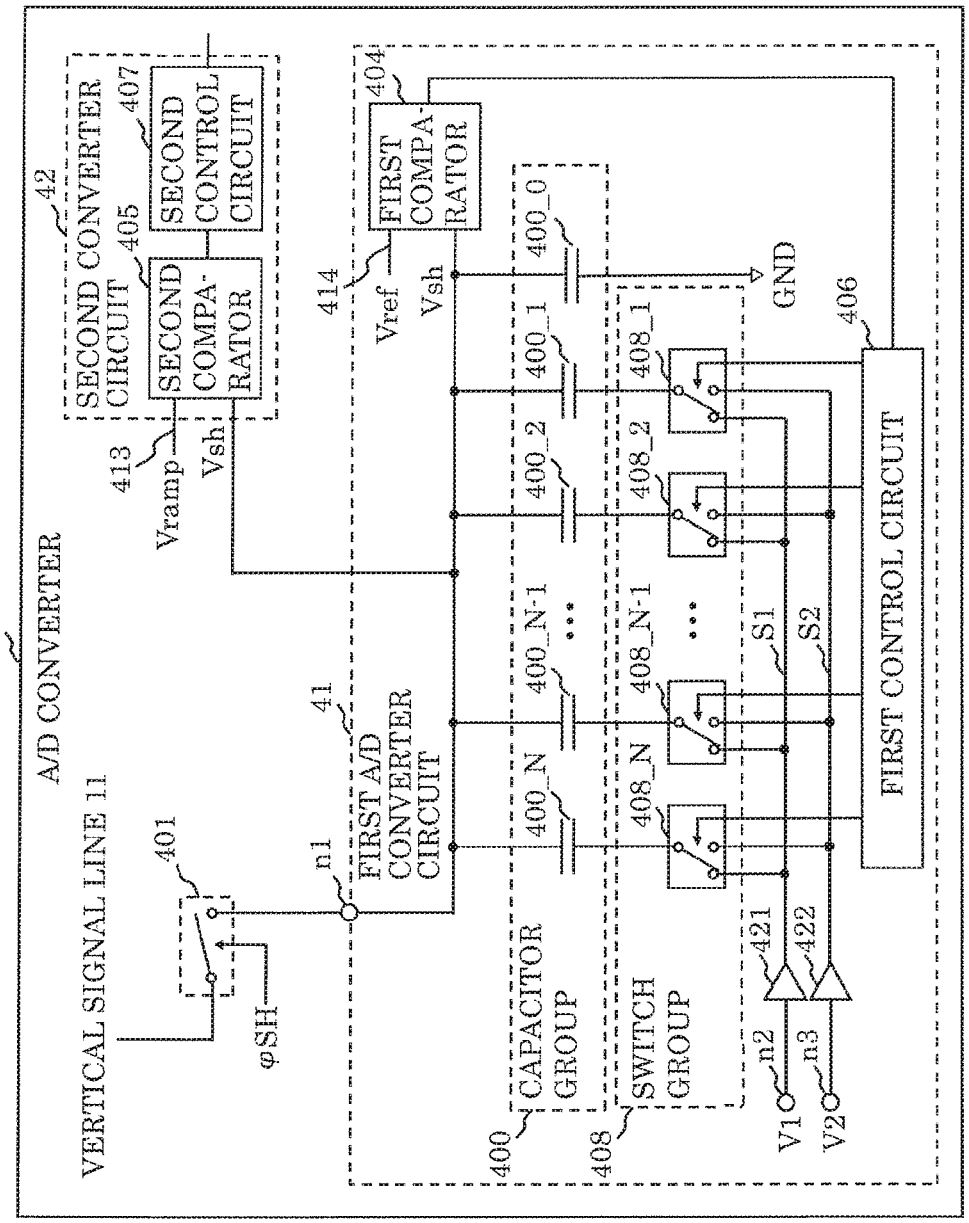
FIG. 11 is a diagram showing a configuration example of the A/D converter according to Embodiment 1.

As illustrated in FIG. 11, buffer circuit 421 and buffer circuit 422 may respectively be inserted in node n2 and node n3 of each A/D converter 40. Since a charge/discharge of capacitors 400_1 to 400_4 of each A/D converter 40 is performed at a high speed in the buffer circuits inserted in each A/D converter 40, it is possible to shorten the second A/D conversion. As illustrated in FIG. 12A and FIG. 12B, outputs of buffer circuits 421 and outputs of buffer circuits 422 disposed in the A/D converters may be connected mutually between the A/D converters. This makes it possible to reduce variations between columns contingent to structural variability.

Note that pixel cell 10 in FIG. 2 has a so-called one pixel per cell structure including photodiode 100, transfer transistor 102, FD 101, reset transistor 103, readout transistor 104, and selection transistor 105. Not being limited to the foregoing, pixel cell 10 can include multiple pixels (i.e., photodiodes 100), and further have a so-called multiple pixels per cell structure in which any or each of FD 101, reset transistor 103, readout transistor 104, and selection transistor 105 are shared within one pixel cell. In other words, in pixel cell 10 in FIG. 2, one of each of reset transistor 103, readout transistor 104, and selection transistor 105 is disposed are one pixel (i.e. photodiode 100), but it is possible to substantially reduce the number of transistors per pixel when reset transistor 103, readout transistor 104, and selection transistor 105 are shared between multiple neighboring pixels cells.

The solid-state imaging device in FIG. 1 can have (i) a structure in which pixels are disposed on the same surface as the front surface of a semiconductor substrate, i.e., surface on which gate terminals and wiring of the transistors are formed, and also (ii) a so-called back-illuminated image sensor (back-illuminated solid-state imaging device) structure in which pixels are disposed on a rear surface of a semiconductor substrate, i.e. rear side surface on which gate terminals and wiring of the transistors are formed.

Figure 13A:
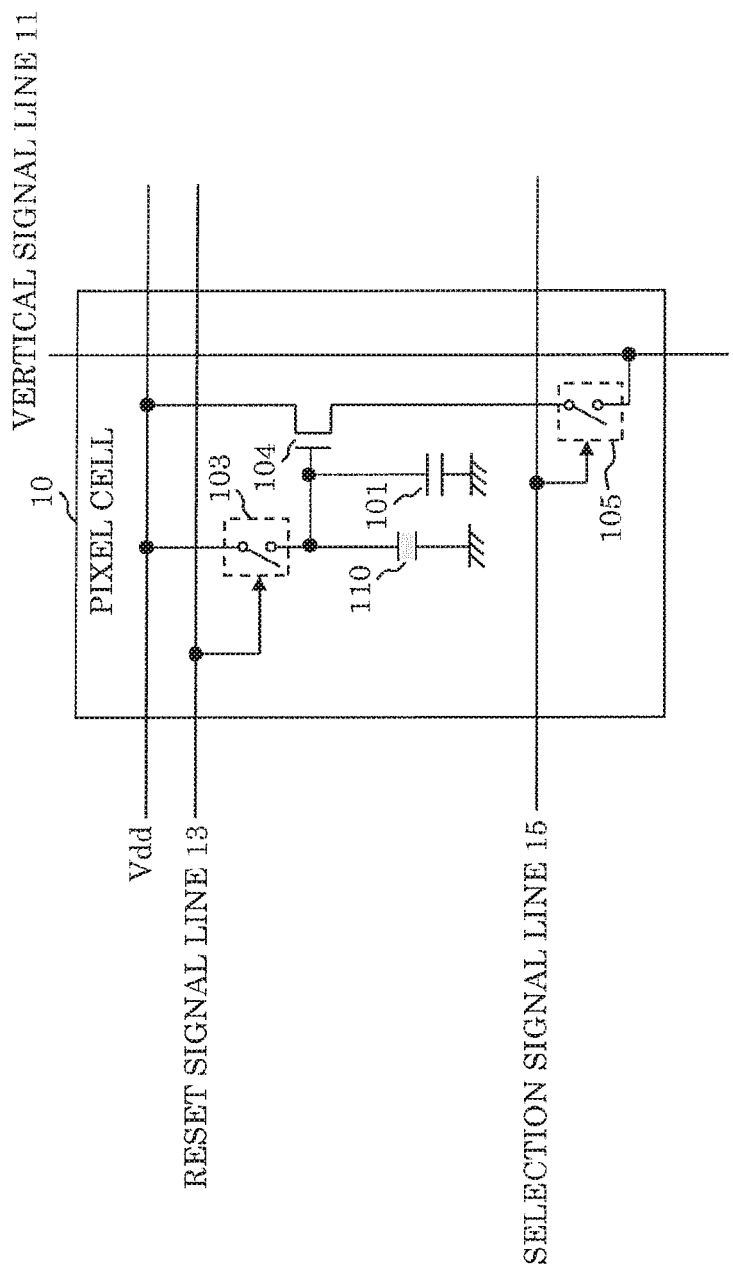
FIG. 13A is a diagram showing another configuration example of the pixel cell according to Embodiment 1.

Additionally, as illustrated in FIG. 13A, the solid-state imaging device can also have an image sensor structure using a photoelectric conversion film (to give an example, a photoelectric conversion film that uses organic material).

Figure 13B:
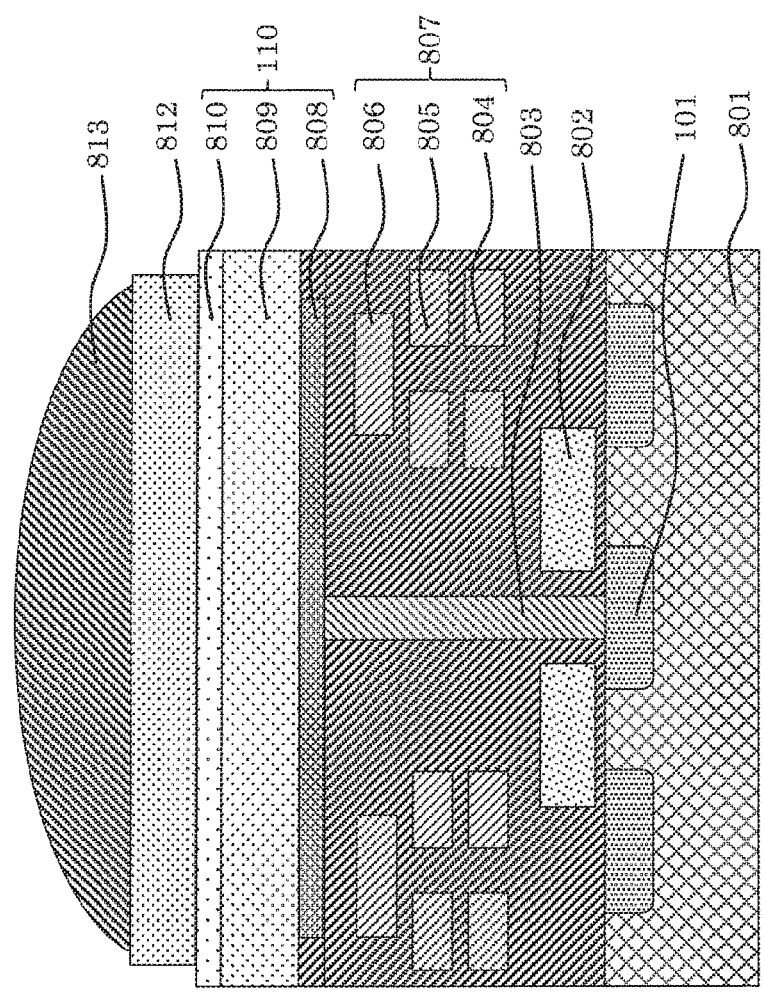
FIG. 13B is a cross-sectional view of the other configuration example of the pixel cell according to Embodiment 1.

In the case of the image sensor structure that uses photoelectric conversion film 110, the image sensor includes transparent electrode 810, pixel electrode 808, and photoelectric conversion layer 809 interposed therebetween, as illustrated in the cross-sectional view in FIG. 13B. FIG. 13B is a cross-sectional view of another configuration example of the pixel cell according to Embodiment 1. The pixel cell in FIG. 13B includes semiconductor substrate 801, gate electrode 802, contact plug 803, wiring layer 807, photoelectric conversion film 110, color filter 812, and on-chip lens 813. FD 101 is disposed in semiconductor substrate 801 and is electrically connected to pixel electrode 808 via contact plug 803. Light is radiated on the above photoelectric conversion layer 809, an electric field is produced when a bias potential is applied between transparent electrode 810 and pixel electrode 808, one of positive and negative charge produced through photoelectric conversion is collected by pixel electrode 808, and the collected charge is accumulated in FD 101. Reading out the charge accumulated in FD 101 is fundamentally the same as with the photodiode in FIG. 2.

A pixel circuit example without transfer transistor is shown in FIG. 13B, but can also include a transfer transistor.

As described above, the solid-state imaging device according to Embodiment 1 includes pixel cells 10 arranged in an X-direction and a Y-direction, pixels cells 10 each including a photoelectric converter that converts an optical signal to an electrical signal; vertical signal lines 11 arranged in the X-direction that are connected to pixel cells 10 and transmit the electrical signal as an analog signal; and A/D converters 40 arranged in the X-direction that are respectively connected to vertical signal lines 11 and convert the analog signal to a digital signal. A/D converters each include first comparator 404 and second comparator 405; perform a first A/D conversion that (i) refines, using first comparator 404, a range including a potential of the analog signal to a range of a potential corresponding to a difference between first potential $V_1$ and second potential $V_2$ through a binary search, and further (ii) generates, based on a result of the binary search, a first digital signal being a high-order portion of the digital signal; and perform a second A/D conversion that generates, based on ramp signal $V_{ramp}$ and the result of the binary search, a second digital signal being a low-order portion of a remainder of the digital signal, by measuring a time necessary for an output of second comparator 405 to be inverted.

With this, the conversion range of the first A/D conversion is determined with first potential $V_1$ and second potential $V_2$ as reference. The conversion range of the second A/D conversion is determined in accordance with the ramp signal. It is therefore possible to easily associate first potential $V_1$ and second potential $V_2$, which serve as reference for the first A/D conversion, with the ramp signal that determines the range of the second A/D conversion, and as a result, it is possible to speed up the A/D conversion.

The solid-state imaging device may include bias generator circuit 45 and D/A converter circuit 47. Bias generator circuit 45 may generate first potential $V_1$ and second potential $V_2$. D/A converter circuit 47 may generate ramp signal $V_{ramp}$.

This makes it possible to easily associate the conversion range of the first A/D conversion determined by first potential $V_1$ and second potential $V_2$ with the conversion range of the second A/D conversion determined by the ramp signal.

Second comparator 405 may compare a quantitative relationship between a potential of a first node connectable to the vertical signal lines and a potential of the ramp signal. Bias generator circuit 45 may generate first potential $V_1$ and second potential $V_2$ respectively using first input potential Va and second input potential Vb. D/A converter circuit 47 may generate the ramp signal using first input potential Va and second input potential Vb.

With this, first potential $V_1$ and second potential $V_2$ are determined using first input potential Va and second input potential Vb. The ramp signal is also determined using the first input potential Va and second input potential Vb. It is therefore possible to associate the conversion range of the first A/D conversion with the conversion range of the second A/D conversion in an optimal relationship.

It is therefore possible to associate the conversion range of the first A/D conversion with the conversion range of the second A/D conversion in an optimal relationship even when first input potential Va and second input potential Vb have changed.

A/D converter 40 each include first buffer circuit 421 and second buffer circuit 422. The first potential generated in bias generator circuit 45 is input into an input terminal of first buffer circuit 421, and a first signal line is connected to an output terminal of first buffer circuit 421. The second potential generated in bias generator circuit 45 is input into an input terminal of second buffer circuit 422, and a second signal line is connected to an output terminal of second buffer circuit 422.

This makes it possible to stabilize first potential $V_1$ and second potential $V_2$, and to limit errors in the first A/D conversion.

The output terminals of first buffer circuits 421 in A/D converters 40 are mutually connected. The output terminals of second buffer circuits 422 in A/D converters 40 are mutually connected.

This makes it possible to limit variations in first potential $V_1$ and second potential $V_2$ in A/D converters 40, and to increase the precision of the first A/D conversion.

The solid-state imaging device may perform the second A/D conversion after the first A/D conversion.

First comparator 404 and second comparator 405 may have a different configuration.

First comparator 404 may be a latch comparator circuit.

First comparator 404 may be a chopper comparator circuit.

Second comparator 405 may be a differential amplifier comparator circuit.

The photoelectric converter may include a photoelectric conversion film.

Embodiment 2

The solid-state imaging device according to Embodiment 2 will be described with reference to FIG. 14 to FIG. 17, mainly focusing on differences with the above embodiment.

Figure 14:
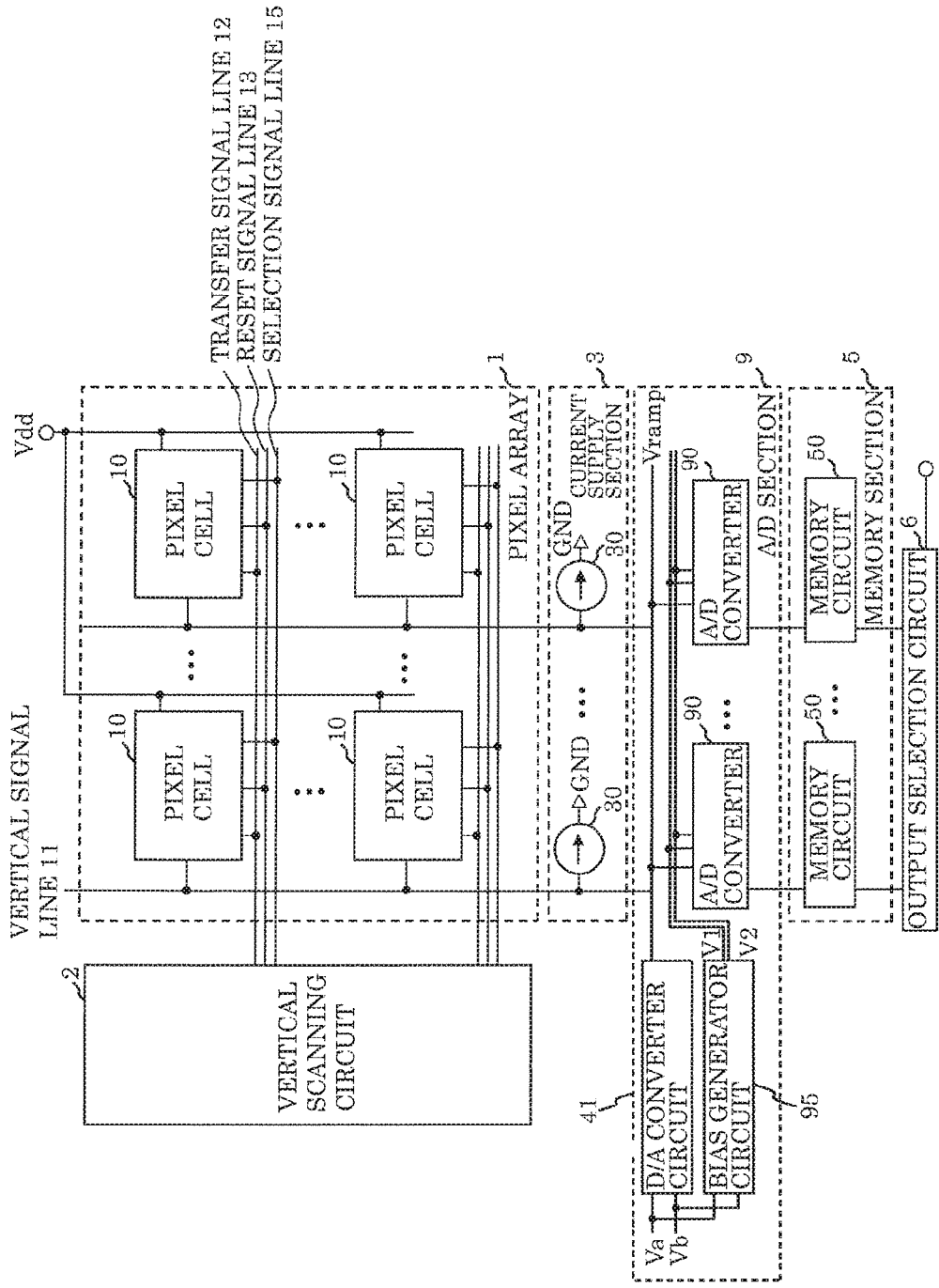
FIG. 14 is a diagram showing a configuration example of the solid-state imaging device according to Embodiment 2.

FIG. 14 is a diagram showing an overall configuration of the solid-state imaging device according to Embodiment 2 in the present invention. The solid-state imaging device in FIG. 14 differs from the solid-state imaging device in FIG. 1 in that the solid-state imaging device in FIG. 14 includes A/D section 9 instead of A/D section 4. Hereinafter, differences with the solid-state imaging device in FIG. 1 will by mainly described.

A/D section 9 differs from A/D section 4 in FIG. 1 in that A/D section 9 includes A/D converters 90 instead of A/D converters 40 and bias generator circuit 95 instead of bias generator circuit 45.

Figure 15:
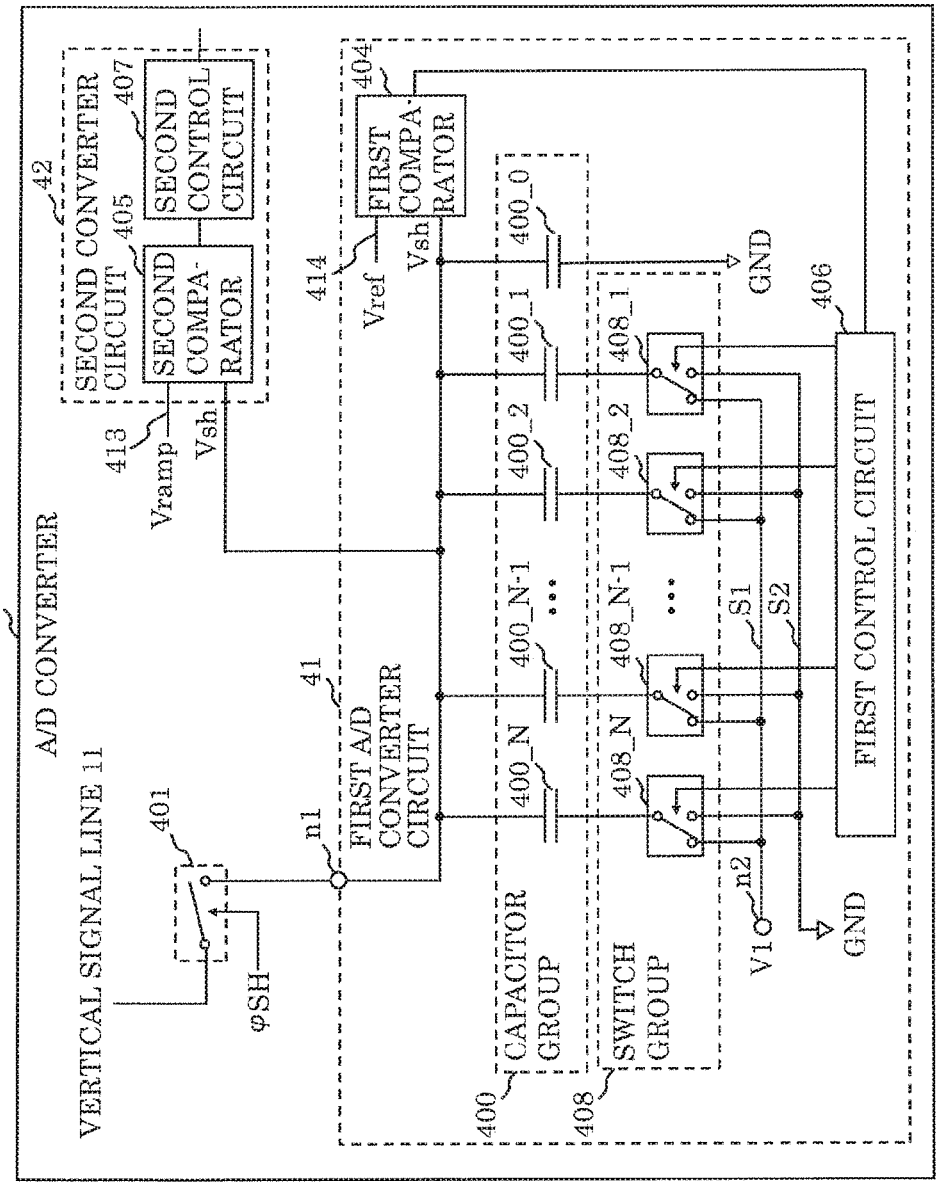
FIG. 15 is a diagram showing a configuration example of an A/D converter according to Embodiment 2.

FIG. 15 is a diagram showing a configuration example of A/D converter 90 according to the present embodiment. A/D converter 90 in FIG. 15 differs from A/D converter 40 in FIG. 3 in that third node n3 is removed (or grounded) and second signal line S2 is changed into a ground line.

Figure 16:
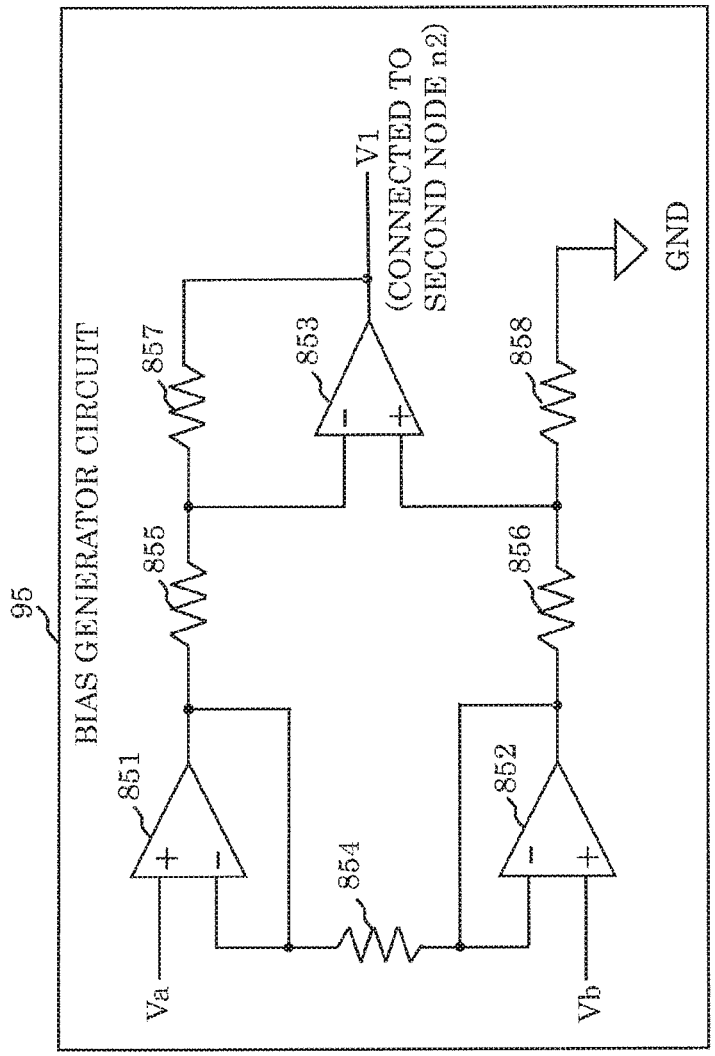
FIG. 16 is a diagram showing a configuration example of a bias generator circuit according to Embodiment 2.

Bias generator circuit 95 generates the signal necessary for generating the first digital signal. Bias generator circuit 95, for example, includes a subtractor circuit having two input terminals and one output terminal. First input potential Va and second input potential Vb are input into the two input terminals of the subtractor circuit. The subtractor circuit outputs first potential $V_1$ from the one output terminal. An example of bias generator circuit 95 is shown in FIG. 16. Bias generator circuit 95 includes first operational amplifier 851, second operational amplifier 852, third operational amplifier 853, first resistor 854, second resistor 855, third resistor 856, fourth resistor 857, and fifth resistor 858.

Figure 17:
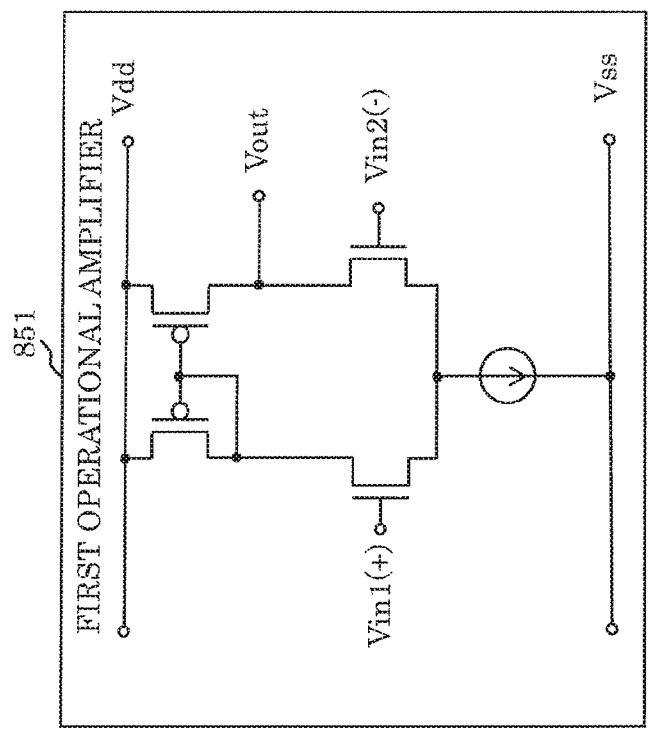
FIG. 17 is a diagram showing a configuration example of an operational amplifier (differential amplifier circuit) according to Embodiment 2.

For example, the differential amplifier circuit shown in FIG. 17 can also be used in the operational amplifier, but is not limited thereto.

First input potential Va is input into a non-inverting input of first operational amplifier 851. Second input potential Vb is input into a non-inverting input of second operational amplifier 852. An inverting input of first operational amplifier 851 and an inverting input of second operational amplifier 852 are connected via first resistor 854. Each output terminal and inverting input terminal of first operational amplifier 851 and second operational amplifier 852 are connected. An output of first operational amplifier 851 is connected to the inverting input of third operational amplifier 853 via second resistor 855. An output of second operational amplifier 852 is connected to a non-inverting input of third operational amplifier 853 via third resistor 856. The inverting input of third operational amplifier 853 is further connected to an output of third operational amplifier 853 via fourth resistor 857. The non-inverting input of third operational amplifier 853 is connected to the GND line via fifth resistor 858. The output of third operational amplifier 853 is connected to second node n2. In this configuration, third operational amplifier 853 sets a resistor value of second resistor 855 and third resistor 856 to $R_2$, a resistor value of fourth resistor 857 and fifth resistor 858 to $R_3$, and outputs a potential of $V_{15}$ as expressed in the following expression to second node n2.

$$V_{15}=(Va-Vb)\times R_3/R_2$$

When $R_2=R_3$, then $V_{15}=Va-Vb$.

An operation of the solid-state imaging device according to the present embodiment is roughly the same as the operation shown as the operation timing diagrams of the solid-state imaging device in Embodiment 1 shown in FIG. 7, FIG. 8, and FIG. 9, but since $V_2$ is the GND line, the potential becomes 0.

During the second A/D conversion operation, $V_{sh}$ can range between $V_{ref}$ and $V_{ref}-(V_1-V_2)/16$. Vramp can also range between $V_{ref}$ and $V_{ref}-(V_1-V_2)/16$ by setting the position of the start resistor in the D/A converter circuit to $V_{ref}$. In other words, it is possible to set the range of $V_{ramp}$ without excess or deficiency with respect to the potential necessary for the second A/D conversion and to perform the second A/D conversion in the shortest time possible. Since it is possible to optionally set an input range that can be A/D converted by adjusting the potential difference between $V_1$ and $V_2$, it is also possible to perform the A/D conversion within a suitable range in accordance with the quantity of the light incident on the pixels, to perform a high-speed and high-resolution A/D conversion, to limit sampling data noise and enhance speed by making the reference potential during data sampling into a low-impedance GND, and to implement a high-quality image sensor with a high frame rate.

A potential of the GND line of A/D converter 90 and bias generator circuit 95 does not need to be set to a fixed value of 0 V. The reason being that since the potential generated by bias generator circuit 95 is generated with the potential of the GND line as reference, $V_{sh}$ during the second A/D conversion operation can range between $V_{ref}$ and $V_{ref}-(Va-Vb)/16$ without depending on the GND line potential.

In the present embodiment, R2=R3, but a configuration in which R2≠R3, a deviation in the potential due to an offset of the operational amplifier and the like is corrected, and $V_{15}$=Va-Vb is implemented is also possible.

Figure 18:
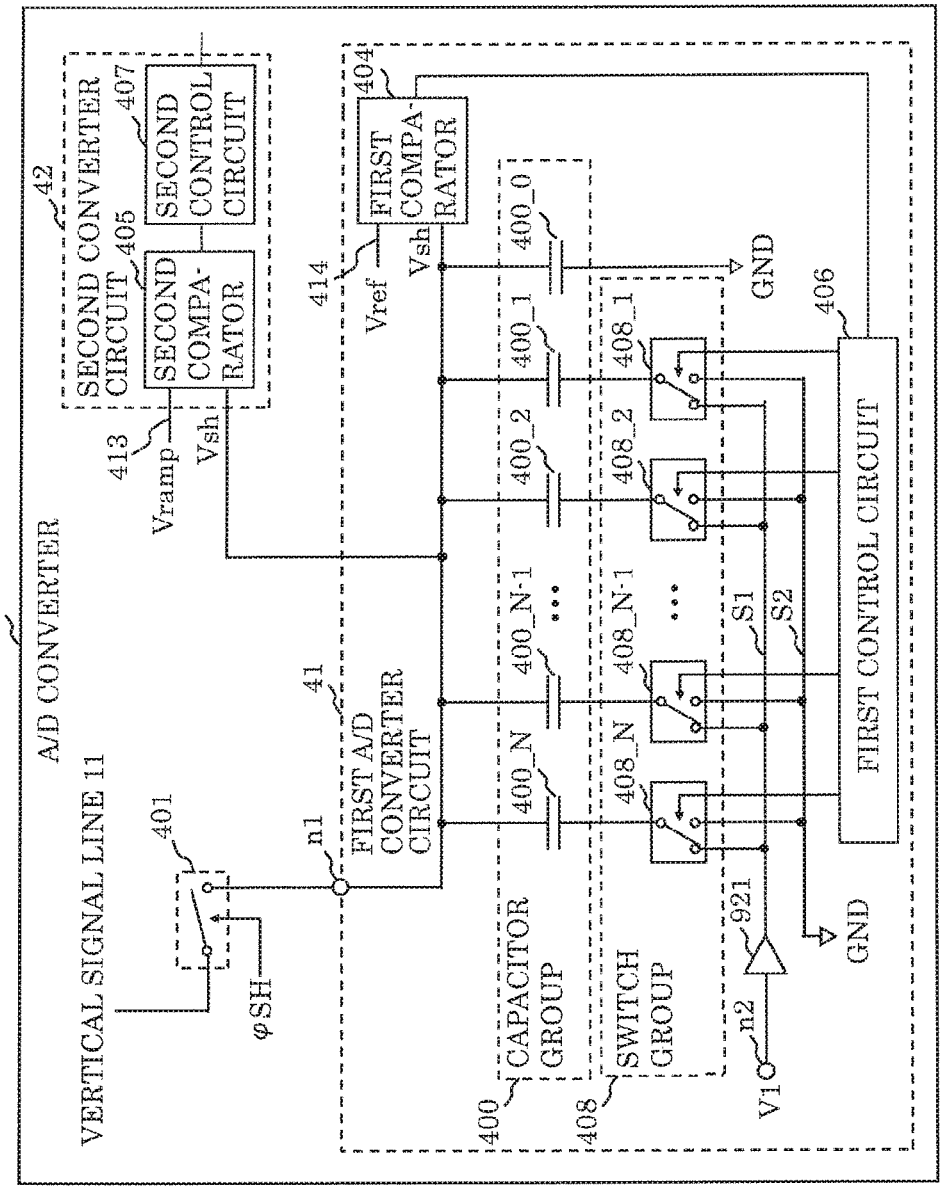
FIG. 18 is a diagram showing a configuration example of an A/D converter according to Embodiment 2.

Note that the solid-state imaging device according to the present embodiment may also include A/D converter 80 (FIG. 18) instead of A/D converter 40 in FIG. 14.

As described above, in the solid-state imaging device according to Embodiment 2, A/D converters 80 each include buffer circuit 921. First potential $V_1$ generated in bias generator circuit 95 is input into an input terminal of buffer circuit 921, and first signal line S1 is connected to an output terminal of buffer circuit 921

This makes it possible to stabilize first potential $V_1$ and to limit errors in the first A/D conversion.

The output terminals of buffer circuits 921 in A/D converters 80 may be mutually connected.

This makes it possible to limit variations in first potential $V_1$ and second potential $V_2$ in A/D converters 40, and to increase the precision of the first A/D conversion.

Bias generator circuit 95 may include a subtractor circuit having two input terminals and one output terminal. First input potential Va and second input potential Vb may be input into the two input terminals of the subtractor circuit. The subtractor circuit may output first potential $V_1$ from the one output terminal.

This makes it possible to simplify the circuit configuration of bias generator circuit 45.

Second potential $V_2$ may be a power supply potential or a ground potential.

This makes it possible to simplify the circuit configuration of the bias generator circuit and the A/D converter.

Embodiment 3

The solid-state imaging device according to Embodiment 3 will be described with reference to FIG. 19 to FIG. 22, mainly focusing on differences with the above embodiments.

Figure 19:
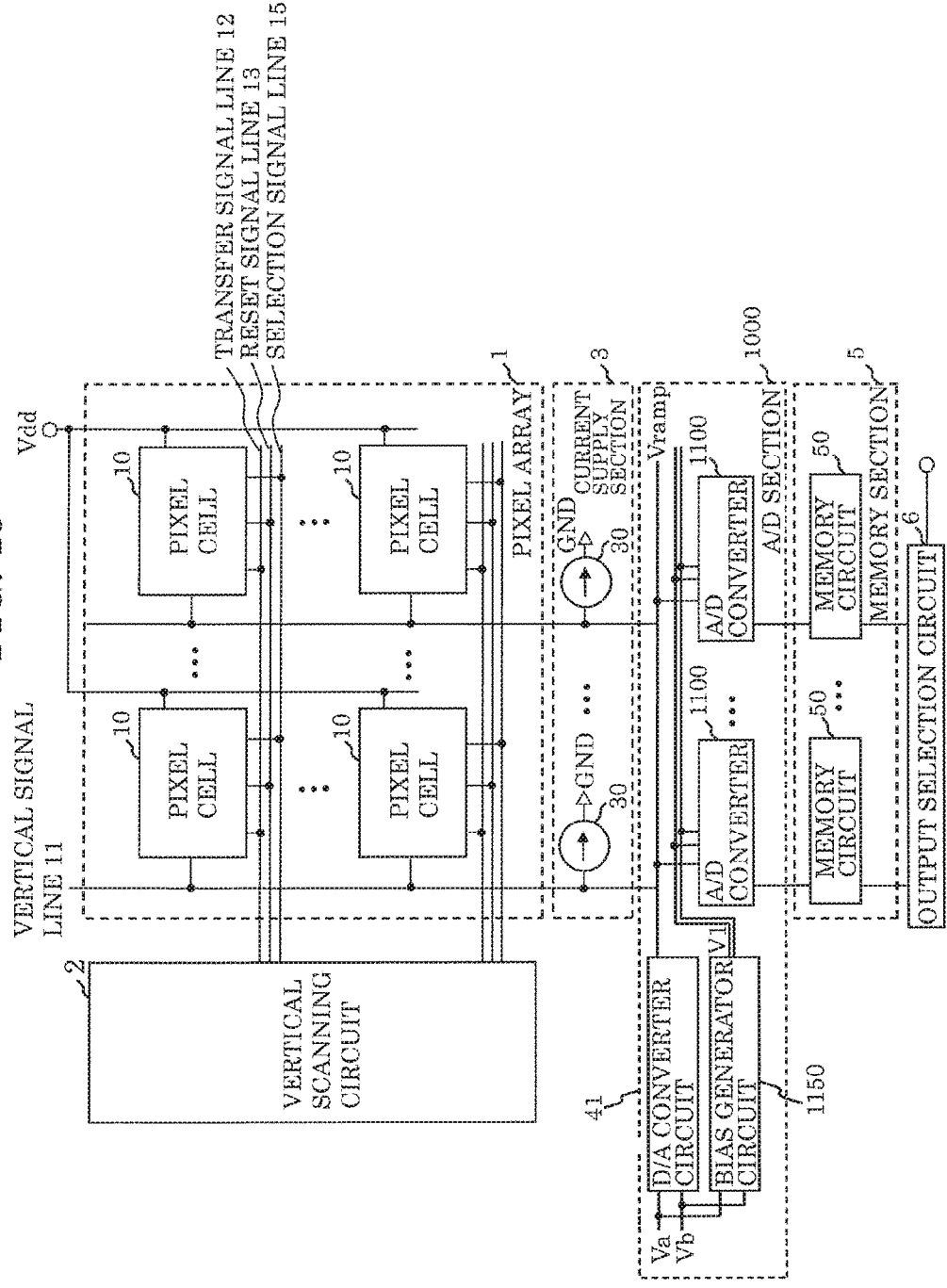
FIG. 19 is a diagram showing a configuration example of the solid-state imaging device according to Embodiment 3.

FIG. 19 is a diagram showing a configuration example of the solid-state imaging device according to Embodiment 3 in the present invention. The solid-state imaging device in FIG. 19 differs from the solid-state imaging device in FIG. 1 in that the solid-state imaging device in FIG. 19 includes A/D section 1000 instead of A/D section 4.

A/D section 1000 differs from A/D section 4 in FIG. 1 in that A/D section 1000 includes A/D converters 1100 instead of A/D converters 40 and bias generator circuit 1150 instead of bias generator circuit 45.

Figure 20:
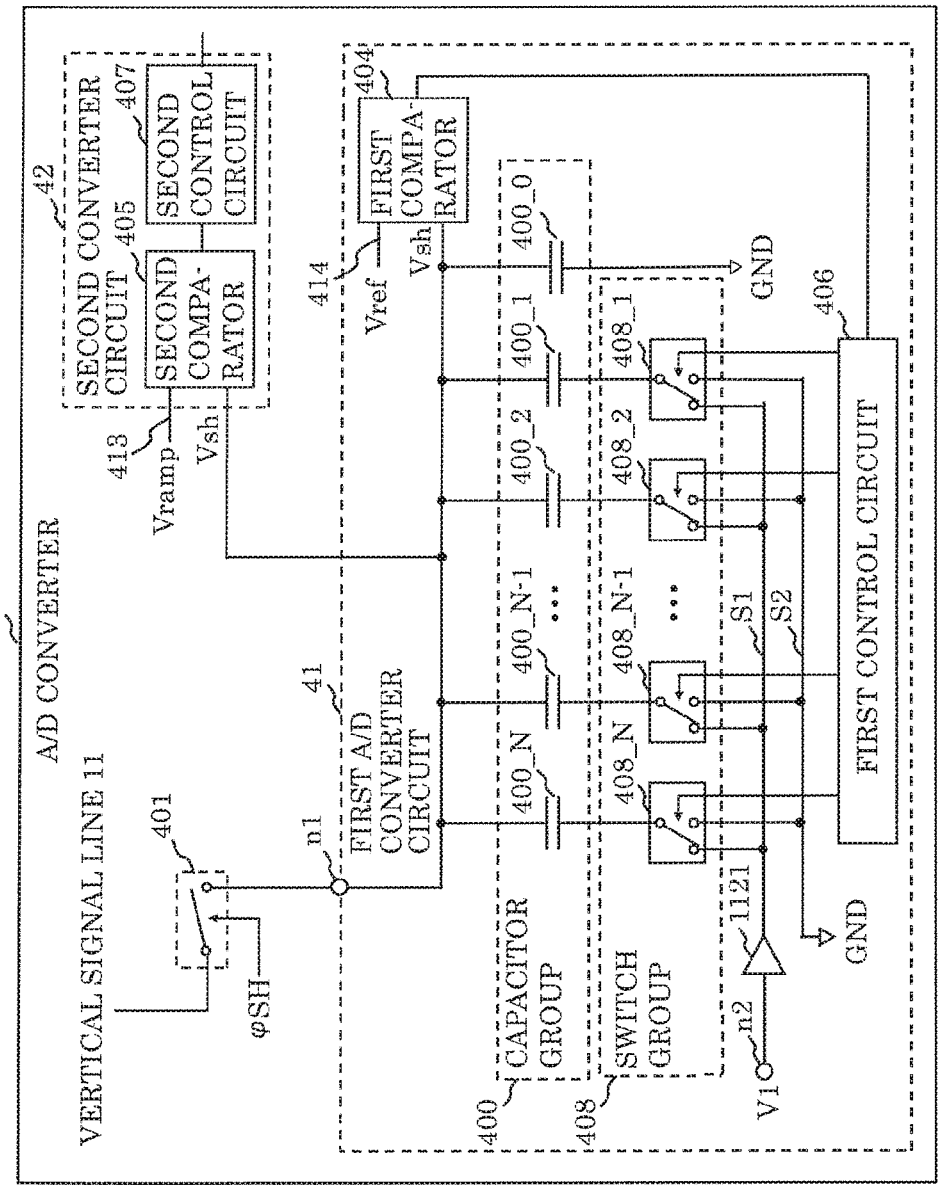
FIG. 20 is a diagram showing a configuration example of an A/D converter according to Embodiment 3.
Figure 21:
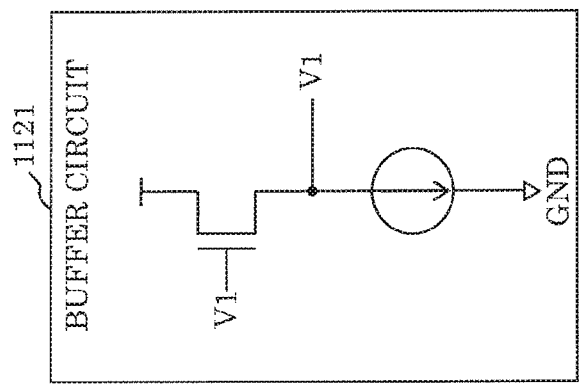
FIG. 21 is a diagram showing a configuration example of a buffer circuit according to Embodiment 3.

FIG. 20 is a diagram showing a configuration example of A/D converter 1100 according to the present embodiment. A/D converter 1000 in FIG. 20 differs from A/D converter 40 in FIG. 3 in that buffer circuit 1121 is added to second node n2, third node n3 is removed (or grounded), and second signal line S2 is changed into a GND line.

Buffer circuit 1121 connects second node n2 to an inputter, connects switch group 408 to an outputter, buffers the signal retained by second node n2 (i.e, first potential $V_1$), and transmits the signal to switch group 408. Buffer circuit 1121 includes, for example, the source follower circuit shown in FIG. 21, but is not limited thereto.

Figure 22:
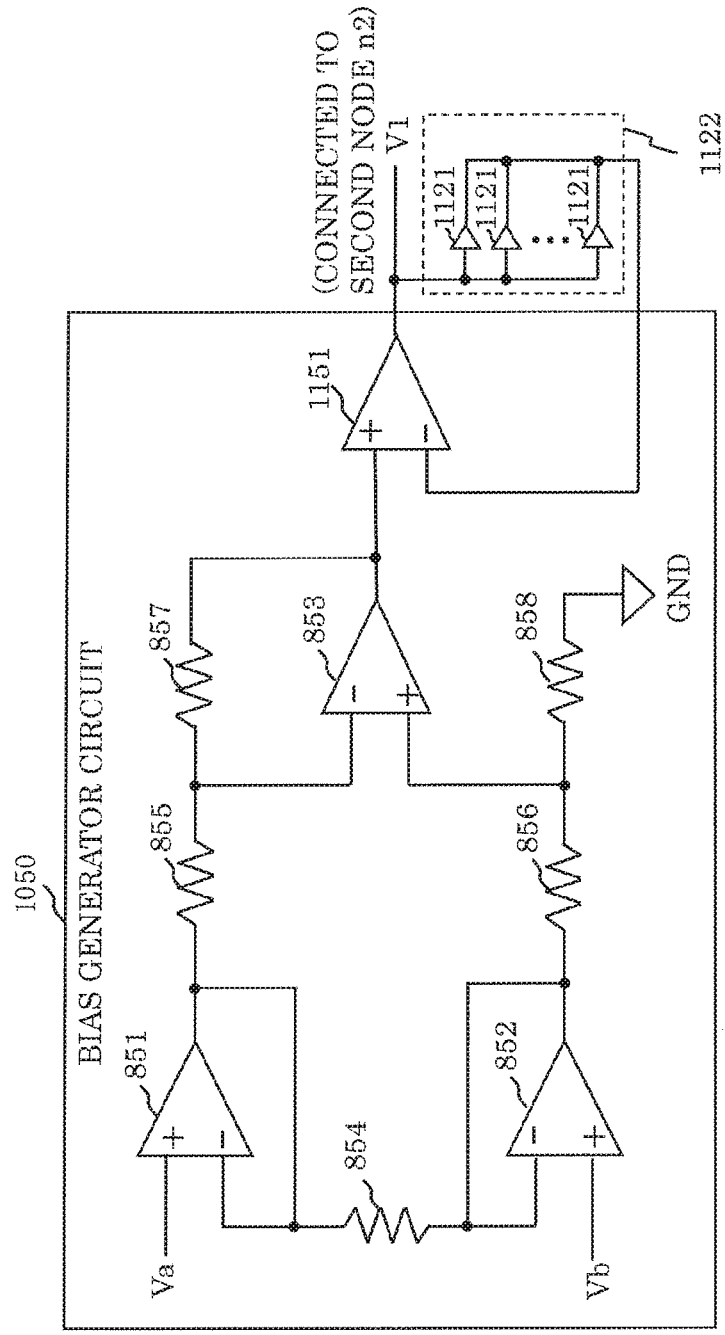
FIG. 22 is a diagram showing a configuration example of a bias generator circuit according to Embodiment 3.

Bias generator circuit 1050 generates the signal necessary for generating the first digital signal. FIG. 22 is a diagram showing a configuration example of bias generator circuit 1050.

Bias generator circuit 1050 generates first potential $V_1$ using first input potential Va and second input potential Vb for performing the SAR conversion, and outputs first potential $V_1$ to second node n2. Bias generator circuit 1050 in FIG. 22 differs from bias generator circuit 95 in FIG. 16 in that fourth operational amplifier 1151 connected to third buffer circuit 1122 has been added.

A non-inverting input of fourth operational amplifier 1151 is connected to the output of third operational amplifier 853. An inverting input and inverting output of fourth operational amplifier 1151 are connected via third buffer circuit 1122. Third buffer circuit 1122 is a replica circuit in which multiple circuits with the same configuration as buffer circuit 1121 are connected in parallel. Second node n2 is connected to an output of fourth operational amplifier 1151. In this configuration, the third operational amplifier sets a resistor value of the second resistor and the third resistor to $R_2$, a resistor value of the fourth resistor and the fifth resistor to $R_3$, and outputs a potential of $V_{23}$ as expressed in the following expression to the third operational amplifier.

$$V_{23}=(Va-Vb)\times R_3/R_2$$

When $R_2=R_3$, then $V_{23}=Va-Vb$. When inputting the same potential into the second buffer circuit and the first buffer circuit, the fourth operational amplifier outputs potential $V_{21}$ expressed with the following expression to second node n2 since the same potential is output.

$$V_{21}=Va-Vb$$

An operation of the solid-state imaging device according to the present embodiment is roughly the same as the operation shown as the operation timing diagrams of the solid-state imaging device in Embodiment 1 shown in FIG. 7, FIG. 8, and FIG. 9, but since $V_2$ is the GND line, the potential becomes 0.

During the second A/D conversion operation, $V_{sh}$ can range between $V_{ref}$ and $V_{ref}-(V_1-V_2)/16$. Vramp can also range between $V_{ref}$ and $V_{ref}-(V_1-V_2)/16$ by setting the position of the start resistor in the D/A converter circuit to $V_{ref}$. In other words, it is possible to set the range of $V_{ramp}$ without excess or deficiency with respect to the potential necessary for the second A/D conversion and to perform the second A/D conversion in the shortest time possible. Since it is possible to optionally set the input range that can be A/D converted by adjusting the potential difference between $V_1$ and $V_2$, it is also possible to perform the A/D conversion within a suitable range in accordance with the quantity of the light incident on the pixels, change the potential during the binary search at a high speed by buffering once and supplying the signal for performing the binary search in each circuit, to perform a high-speed and high-resolution A/D conversion, and to implement a high-quality image sensor with a high frame rate.

A potential of the GND line of the A/D converter and the bias generator circuit does not need to be set to a fixed value of 0 V. The reason being that since a 15th potential generated by the bias generator circuit is generated with the potential of the GND line as reference, $V_{sh}$ during the second A/D conversion operation can range between $V_{ref}$ and $V_{ref}-(V_1-V_2)/16$ without depending on the GND line potential.

In the present embodiment, R2=R3, but a configuration in which R2≠R3, a deviation in the potential due to an offset of the operational amplifier and the like is corrected, and $V_{21}=V_1-V_2$ is implemented is possible.

As described above, the solid-state imaging device according to Embodiment 3 includes operational amplifier 1151 and replica circuit 1122 in which multiple circuits with the same configuration as buffer circuit 1121 are connected in parallel. One input terminal of operational amplifier 1151 is connected to the one output terminal of the subtractor circuit. Another input terminal of operational amplifier 1151 is connected to an output line of the replica circuit. An output terminal of operational amplifier 1151 is connected to the first signal line.

This makes it possible to limit variations in first potential $V_1$ and second potential $V_2$ in the A/D converters, and to increase the precision of the first A/D conversion.

The subtractor circuit may change an amplification factor.

This makes it possible to set first potential $V_1$ to a desired value even by changing the amplification factor.

The buffer circuit may be a source follower circuit.

This makes it possible to simplify the circuit configuration of the buffer circuit.

Embodiment 4

Figure 23:
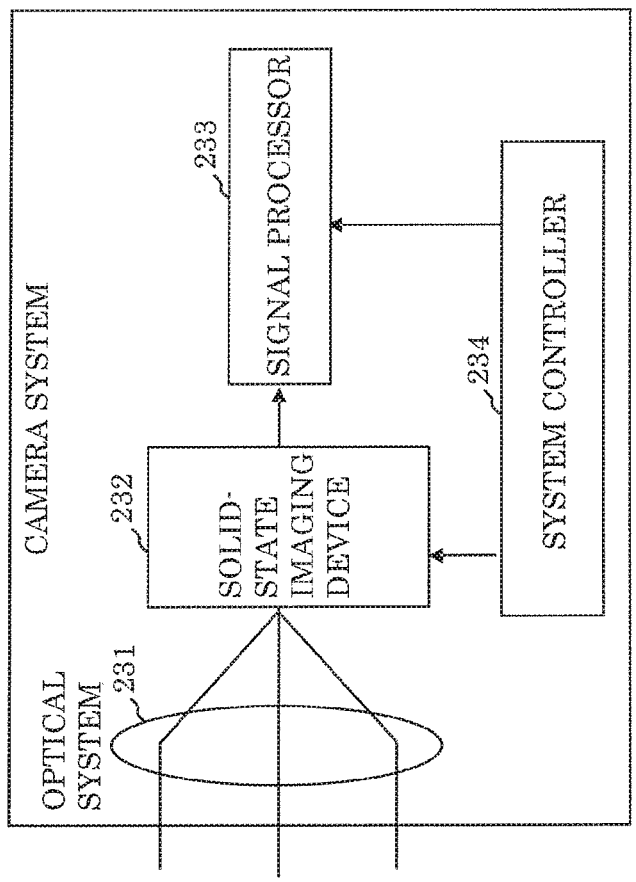
FIG. 23 is a diagram showing a configuration example of a camera system according to Embodiment 4.

A camera system according to Embodiment 4 will be described. FIG. 23 shows an example of a configuration of the camera system included in the solid-state imaging device according to Embodiment 4.

The camera system includes optical system 231, solid-state imaging device 232, signal processor 233, and system controller 234.

Optical system 231 includes at least one lens.

Solid-state imaging device 232 is any of the solid-state imaging devices in the above embodiments (Embodiments 1 to 3).

Signal processor 233 signal processes data recorded by the solid-state imaging device, and outputs the recorded data as an image or data.

System controller 234 controls the solid-state imaging device, the signal processor, etc.

The camera system in the present embodiment makes it possible to implement a high-speed A/D conversion and enables high-quality imaging at a high frame rate while limiting noise by using any of the solid-state imaging devices in the above embodiments (Embodiments 1 to 3). High-speed and high-precision sensor imaging is, therefore, possible, and as a result, it is possible to provide a camera system with good image properties.

As described above, the camera system according to Embodiment 4 includes any of the solid-state imaging devices described in Embodiments 1 to 3.

This makes it possible to easily associate first potential $V_1$ and second potential $V_2$ that serve as reference for the first A/D conversion with the ramp signal that determines the range of the second A/D conversion, and as a result, it is possible to speed up the A/D conversion.

INDUSTRIAL APPLICABILITY

The present disclosure can be suitably used for a solid-state imaging device and a camera.

The invention claimed is:

1. A solid-state imaging device, comprising:
   a plurality of pixel cells arranged in an X-direction and a Y-direction, the plurality of pixels cells each including a photoelectric converter that converts an optical signal to an electrical signal;
   a plurality of vertical signal lines arranged in the X-direction that are connected to the plurality of pixel cells and transmit the electrical signal as an analog signal; and
   a plurality of analog-to-digital (A/D) converters arranged in the X-direction that are respectively connected to the plurality of vertical signal lines and convert the analog signal to a digital signal, wherein
   the plurality of A/D converters each:
      include a first comparator and a second comparator;
      perform a first A/D conversion that (i) refines, using the first comparator, a range including a potential of the analog signal to a range of a potential corresponding to a difference between a first potential and a second potential through a binary search, and further (ii) generates, based on a result of the binary search, a first digital signal being a high-order portion of the digital signal; and
      perform a second A/D conversion that generates, based on a ramp signal and the result of the binary search, a second digital signal being a low-order portion of a remainder of the digital signal, by measuring a time necessary for an output of the second comparator to be inverted.

2. The solid-state imaging device according to claim 1, further comprising:
   a bias generator circuit and a digital-to-analog (D/A) converter circuit, wherein the bias generator circuit generates the first potential and the second potential, and the D/A converter circuit generates the ramp signal.

3. The solid-state imaging device according to claim 2, wherein the second comparator compares a quantitative relationship between a potential of a first node connectable to the plurality of vertical signal lines and a potential of the ramp signal, the bias generator circuit generates the first potential and the second potential respectively using a first input potential and a second input potential, and the D/A converter circuit generates the ramp signal using the first input potential and the second input potential.

4. The solid-state imaging device according to claim 2, wherein the plurality of A/D converters each include a first buffer circuit and a second buffer circuit, the first potential generated in the bias generator circuit is input into an input terminal of the first buffer circuit, and a first signal line is connected to an output terminal of the first buffer circuit, and the second potential generated in the bias generator circuit is input into an input terminal of the second buffer circuit, and a second signal line is connected to an output terminal of the second buffer circuit.

5. The solid-state imaging device according to claim 4, wherein the output terminals of the first buffer circuits in the plurality of A/D converters are mutually connected, and the output terminals of the second buffer circuits in the plurality of A/D converters are mutually connected.

6. The solid-state imaging device according to claim 2, wherein the plurality of A/D converters each include a buffer circuit, and the first potential generated in the bias generator circuit is input into an input terminal of the buffer circuit, and a first signal line is connected to an output terminal of the buffer circuit.

7. The solid-state imaging device according to claim 6, wherein the output terminals of the buffer circuits in the plurality of A/D converters are mutually connected.

8. The solid-state imaging device according to claim 6, wherein the bias generator circuit includes a subtractor circuit having two input terminals and one output terminal, the first input potential and the second input potential are input into the two input terminals of the subtractor circuit, and the subtractor circuit outputs the first potential from the one output terminal.

9. The solid-state imaging device according to claim 6, wherein the second potential is a power supply potential or a ground potential.

10. The solid-state imaging device according to claim 8, further comprising:

an operational amplifier and a replica circuit in which a plurality of circuits with the same configuration as the buffer circuit are connected in parallel, wherein one input terminal of the operational amplifier is connected to the one output terminal of the subtractor circuit, another input terminal of the operational amplifier is connected to an output line of the replica circuit, and an output terminal of the operational amplifier is connected to the first signal line.

11. The solid-state imaging device according to claim 8, wherein the subtractor circuit changes an amplification factor.

12. The solid-state imaging device according to claim 4, wherein a buffer circuit is a source follower circuit.

13. The solid-state imaging device according to claim 1, wherein the second A/D conversion is performed after the first A/D conversion.

14. The solid-state imaging device according to claim 1, wherein the first comparator and the second comparator have a different configuration.

15. The solid-state imaging device according to claim 1, wherein the first comparator is a latch comparator circuit.

16. The solid-state imaging device according to claim 1, wherein the first comparator is a chopper comparator circuit.

17. The solid-state imaging device according to claim 1, wherein the second comparator is a differential amplifier comparator circuit.

18. The solid-state imaging device according to claim 1, wherein the photoelectric converter includes a photoelectric conversion film.

19. A camera system, comprising:

the solid-state imaging device according to claim 1.

* * * * *